US012604476B2

(12) United States Patent
Yang

(10) Patent No.: US 12,604,476 B2
(45) Date of Patent: Apr. 14, 2026

(54) MEMORY DEVICE AND MANUFACTURING METHOD THEREOF

(71) Applicant: MACRONIX INTERNATIONAL CO., LTD., Hsinchu (TW)

(72) Inventor: Chih-Kai Yang, Kaohsiung City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 400 days.

(21) Appl. No.: 18/299,097

(22) Filed: Apr. 12, 2023

(65) Prior Publication Data

US 2024/0349506 A1 Oct. 17, 2024

(51) Int. Cl.
*H10B 43/35* (2023.01)
*H10B 43/27* (2023.01)

(52) U.S. Cl.
CPC ............. *H10B 43/35* (2023.02); *H10B 43/27* (2023.02)

(58) Field of Classification Search
CPC ........ H10B 43/10; H10B 43/40; H10B 41/40; H10B 43/27; H10B 43/35; H01L 23/481; H01L 23/5283; H01L 21/76895; H10W 20/0698; H10W 20/20; H10W 20/435
See application file for complete search history.

(56) References Cited

U.S. PATENT DOCUMENTS 11,222,954 B2 1/2022 Cui
11,417,369 B2 8/2022 Lu et al.

11,825,645 B2 11/2023 Lu
2014/0159114 A1* 6/2014 Zheng ................ H10D 30/0413
438/585
2021/0167129 A1* 6/2021 Reznicek ........... H10N 70/8418
2023/0292490 A1* 9/2023 Lee ........................ H10B 12/05
2023/0343394 A1* 10/2023 Scarbrough ......... H01L 23/5283
2023/0354577 A1* 11/2023 Zhao ...................... H10B 43/27
2024/0315027 A1* 9/2024 Clampitt ................ H10B 43/27

FOREIGN PATENT DOCUMENTS

TW 202139425 A 10/2021
TW 202211439 A 3/2022
TW 202240856 A 10/2022
TW 202303935 A 1/2023

* cited by examiner

*Primary Examiner* — Steven B Gauthier
*Assistant Examiner* — Marc-Anthony Armand
(74) *Attorney, Agent, or Firm* — McClure, Qualey & Rodack, LLP

(57) ABSTRACT

A memory device includes a substrate, a plurality of conductive layers, a plurality of dielectric layers, a memory structure, a select gate structure and a bit line contact. The conductive layers and the dielectric layers are interlaced and stacked on the substrate. The memory structure penetrates through the conductive layers and the dielectric layers, and the memory structure includes a channel structure and a conductive plug disposed on the channel structure. The select gate structure is disposed on a sidewall of the memory structure. The select gate structure includes a select gate dielectric layer and a select gate electrode surrounded by the select gate dielectric layer. A top surface of the select gate electrode is between a top surface of the conductive plug and a top surface of a topmost layer of the conductive layers. The bit line contact is electrically connected to the memory structure.

13 Claims, 23 Drawing Sheets

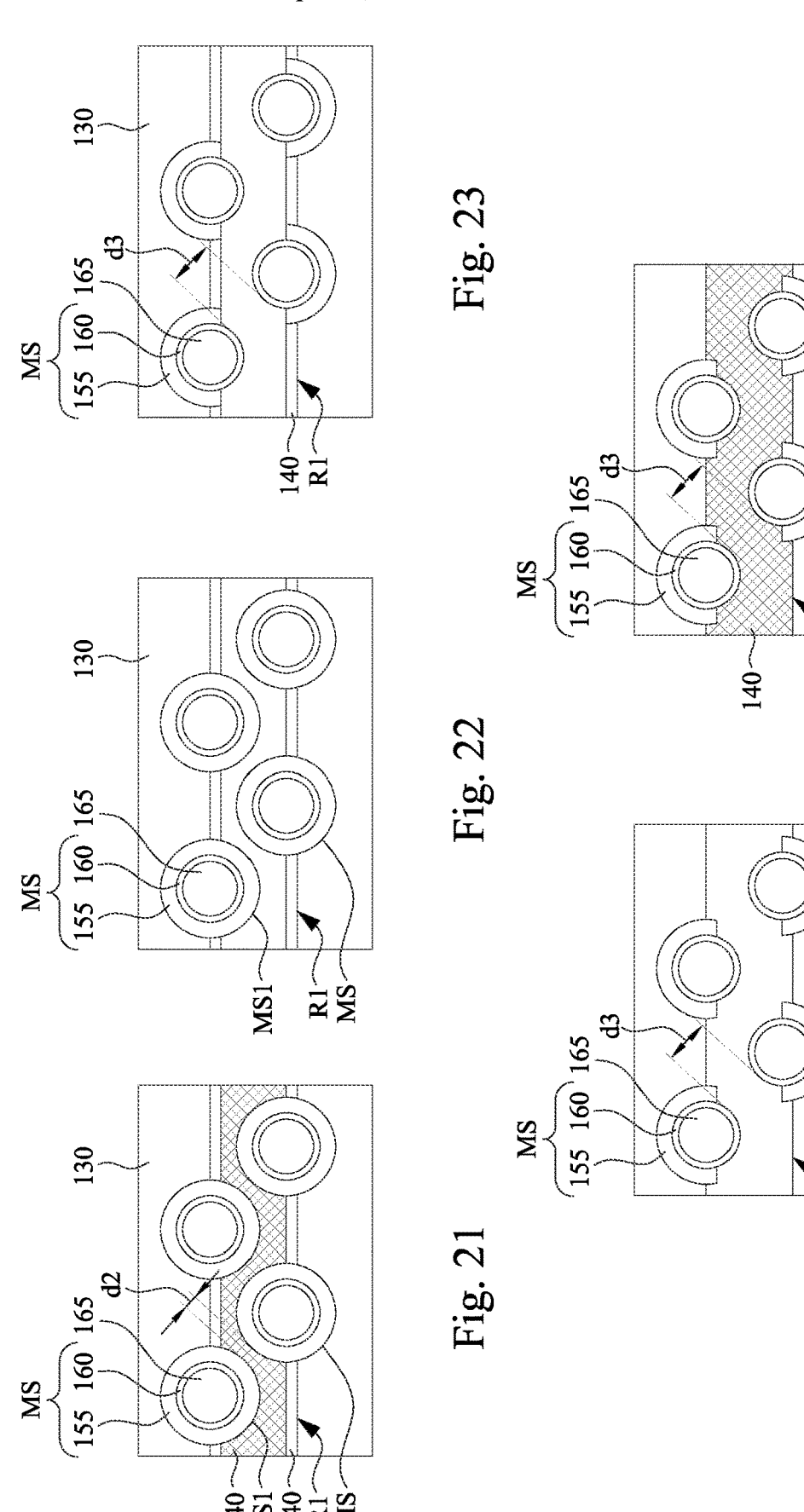

1

MEMORY DEVICE AND MANUFACTURING METHOD THEREOF

BACKGROUND

Technical Field

The present disclosure relates to a memory device and a manufacturing method of the memory device.

Description of Related Art

In semiconductor industry, the structures of memory devices have been changed constantly, and the storage capacity of the memory devices has been increased continuously. Memory devices are used in storage elements for many products such as MP3 players, digital cameras, computer files, and so on. As the application increases, the demand for the memory devices focuses on small size and large memory capacity. For satisfying the requirement, a memory device having a high element density and a small size and the manufacturing method thereof are in need. Further, how to avoid or prevent the bridge phenomena in the memory device is particularly important in the industry.

SUMMARY

One aspect of the present disclosure is a memory device.

According to some embodiments of the present disclosure, a memory device includes a substrate, a plurality of conductive layers, a plurality of dielectric layers, a memory structure, a select gate structure and a bit line contact. The conductive layers and the dielectric layers are interlaced and stacked on the substrate. The memory structure penetrates through the conductive layers and the dielectric layers, in which the memory structure includes a channel structure and a conductive plug disposed on the channel structure. The select gate structure is disposed on a sidewall of the memory structure, in which the select gate structure includes a select gate dielectric layer and a select gate electrode surrounded by the select gate dielectric layer, and in which a top surface of the select gate electrode is between a top surface of the conductive plug and a top surface of a topmost layer of the conductive layers. The bit line contact is electrically connected to the memory structure.

In some embodiments of the present disclosure, the bit line contact includes a bottom portion embedded in the conductive plug.

In some embodiments of the present disclosure, a ratio of the minimum distance to the thickness is in a range of about 1 to about 4.

In some embodiments of the present disclosure, the select gate structure further includes a cap layer on the select gate electrode, and the bit line contact penetrates through the cap layer and the select gate dielectric layer of the select gate structure.

In some embodiments of the present disclosure, a topmost layer of the dielectric layers has a sidewall spaced apart from the memory structure, and a minimum distance between the sidewall of the topmost layer of the dielectric layers and the sidewall of the memory structure is greater than a thickness of one of the conductive layers.

In some embodiments of the present disclosure, the bit line contact is in contact with the select gate dielectric layer of the select gate structure.

In some embodiments of the present disclosure, the memory device further includes a plurality of word line contacts above the substrate, in which the word line contacts are respectively electrically connected to the conductive layers.

In some embodiments of the present disclosure, the memory device further includes a contact structure penetrating through the conductive layers and the dielectric layers, and the contact structure is spaced apart from the select gate structure.

In some embodiments of the present disclosure, the memory device further includes a select gate contact electrically connected to the select gate electrode.

Another aspect of the present disclosure is a memory device.

According to some other embodiments of the present disclosure, a memory device includes a substrate, a plurality of conductive layers, a plurality of dielectric layers, a memory structure and a select gate structure. The conductive layers and the dielectric layers are interlaced and stacked on the substrate. The memory structure penetrates through the conductive layers and the dielectric layers, in which the memory structure includes a channel structure and a conductive plug disposed on the channel structure. The select gate structure penetrates through at least one of the conductive layers and at least one of the dielectric layers, and the select gate structure is in contact with the memory structure. The select gate structure includes a select gate dielectric layer and a select gate electrode. The select gate dielectric layer extends toward and covers a top surface of the conductive plug of the memory structure. The select gate electrode is disposed on the select gate dielectric layer, and the select gate dielectric layer surrounds the select gate electrode.

In some embodiments of the present disclosure, the select gate dielectric layer includes a portion below the select gate electrode.

In some embodiments of the present disclosure, the select gate structure further includes a cap layer on the select gate electrode, in which the select gate dielectric layer further surrounds the cap layer.

In some embodiments of the present disclosure, the cap layer of the select gate structure covers the conductive plug of the memory structure.

In some embodiments of the present disclosure, the memory device further includes an isolation layer disposed above the conductive layers, the dielectric layers and the memory structure, in which the select gate dielectric layer of the select gate structure is in contact with a sidewall of the isolation layer.

Another aspect of the present disclosure is a manufacturing method of a memory device.

According to some other embodiments of the present disclosure, the manufacturing method of a memory device includes forming a plurality of sacrificial material layers and a plurality of dielectric layers interlaced and stacked on a substrate. A sacrificial structure is formed downwards penetrating through at least one of the sacrificial material layers and at least one of the dielectric layers. A memory structure is formed downwards penetrating through the sacrificial material layers and the dielectric layers, in which the memory structure is in contact with the sacrificial structure, and in which the sacrificial structure has a width greater than a thickness of one of the sacrificial material layers. A slit trench is formed downwards penetrating through the sacrificial material layers and the dielectric layers, in which the slit trench is spaced apart from the sacrificial structure. The sacrificial material layers and the sacrificial structure are respectively replaced with a plurality of conductive layers and a conductive material structure, in which the conductive material structure has a void. A contact structure is formed in the slit trench. The conductive material structure is removed to form a recess exposing a sidewall of the memory structure. After forming the contact structure, forming a select gate structure in the recess.

In some embodiments of the present disclosure, removing the conductive material structure to form the recess is performed such that a sidewall and a bottom surface of a topmost layer of the dielectric layers are exposed.

In some embodiments of the present disclosure, forming the select gate structure includes forming a dielectric layer in the recess. The conductive material layer is formed in the recess. The dielectric layer is etched to form a select gate dielectric layer. The conductive material layer is etched to form a select gate electrode such that the select gate structure including the select gate electrode and the select gate dielectric layer are defined in the recess.

In some embodiments of the present disclosure, a top surface of the select gate electrode is between a top surface of the memory structure and a top surface of a topmost layer of the conductive layers.

In some embodiments of the present disclosure, forming the memory structure further includes forming an opening downwards penetrating through the sacrificial material layers and the dielectric layers. A memory structure layer is formed on a sidewall of the opening. A channel layer is formed on a sidewall of the memory structure layer. A dielectric material is filled in the opening to form a dielectric structure on the channel layer, in which the channel layer includes a portion below the dielectric structure. The memory structure layer, the channel layer and the dielectric structure are recessed to form a space. A conductive plug is formed in the space to form the memory structure including the memory structure layer, the channel layer, the dielectric structure and the conductive plug.

In some embodiments of the present disclosure, the manufacturing method of a memory device further includes after forming the memory structure, removing the sacrificial structure to expose the memory structure layer. A portion of the memory structure layer is removed to expose the channel layer. The sacrificial structure is formed again such that the sacrificial structure is in contact with the memory structure layer and the channel layer.

In the aforementioned embodiments of the present disclosure, since the select gate structure is disposed on the sidewall of the memory structure, the density and the usage efficiency of the memory device can be improved. Furthermore, since the top surface of the select gate electrode is between the top surface of the conductive plug and the top surface of the topmost layer of the conductive layers, bridge phenomena between the bit line contact and the select gate electrode can be avoided or prevented.

BRIEF DESCRIPTION OF THE DRAWINGS

The disclosure can be more fully understood by reading the following detailed description of the embodiments, with reference made to the accompanying drawings as follows:

FIGS. 21-25 are top views of a process at various stages of a manufacturing method of a memory device according to some embodiments of the present disclosure.

DETAILED DESCRIPTION

Figures 1A, 1B:
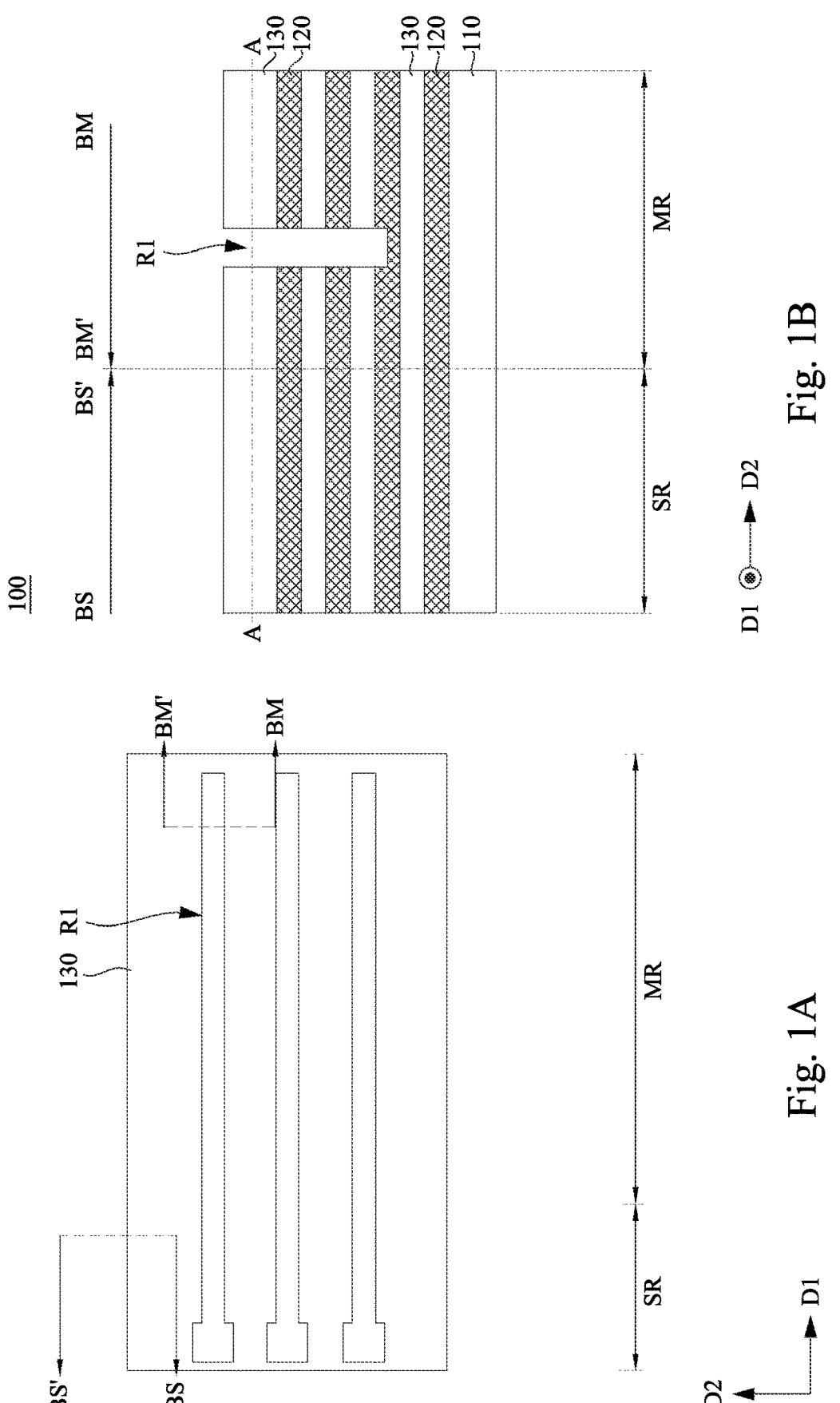
FIGS. 1A, 2A, 3A, 4A, 5A, 6A, 7A, 8A, 9A, 10A, 11A, 12A, 13A, 14A, 15A, 16A, 17A, 18A and 19A are top views of a process at various stages of a manufacturing method of a memory device according to some embodiments of the present disclosure.
FIGS. 1B, 2B, 3B, 4B, 5B, 6B, 7B, 8B, 9B, 10B, 11B, 12B, 13B, 14B, 15B, 16B, 17B, 18B and 19B are cross-sectional views of a process at various stages of a manufacturing method of a memory device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about", "approximately", or "substantially" shall generally mean within 10 percent, or within 5 percent of a given value or range. Numerical quantities given herein are approximated, meaning that the term "around", "about", "approximately", or "substantially" can be inferred if not expressly stated.

In the embodiments of the present disclosure, a memory device and a manufacturing method of the same are provided. It is noted that the term "top view" may be used herein for ease of description to refer to as a cross-sectional view of the topmost layer of the dielectric layers (i.e., the cross-section along line A-A in FIG. 1B) of the memory device in order to highlight the technical features of the inventive concept. FIGS. 1A-1B, 2A-2B, 3A-3B, 4A-4B, 5A-5B, 6A-6B, 7A-7B, 8A-8B, 9A-9B, 10A-10B, 11A-11B, 12A-12B, 13A-13B, 14A-14B, 15A-15B, 16A-16B, 17A-17B, 18A-18B and 19A-19C are views of a process at various stages of a manufacturing method of a memory device 100 according to some embodiments of the present disclosure.

The memory device 100 has a memory region MR and a staircase region SR, in which the memory region MR is a region to form a memory array. The staircase region SR is adjacent to the memory region MR. It is noted that the staircase region SR may be viewed along a direction of arrow line BS-BS' (i.e., from "BS" to "BS'") and the memory region MR may be viewed along a direction of arrow line BM-BM' (i.e., from "BM" to "BM'") in the cross-sectional views (e.g., FIGS. 1B, 2B, 3B, 4B, 5B, 6B, 7B, 8B, 9B, 10B, 11B, 12B, 13B, 14B, 15B, 16B, 17B and 19B). In aforementioned cross-sectional views, the direction of arrow line BS-BS' is the same as a second direction D2, and the direction of the arrow line BM-BM' is opposite to the second direction D2. Further, arrow line BS-BS' and arrow line BM-BM' in the cross-sectional views (e.g., FIGS. 1B, 2B, 3B, 4B, 5B, 6B, 7B, 8B, 9B, 10B, 11B, 12B, 13B, 14B, 15B, 16B, 17B and 19B) respectively correspond to line BS-BS' and line BM-BM' in the top views (e.g., FIGS. 1A, 2A, 3A, 4A, 5A, 6A, 7A, 8A, 9A, 10A, 11A, 12A, 13A, 14A, 15A, 16A, 17A and 19A).

FIG. 1A is a top view of a step of manufacturing the memory device 100, and FIG. 1B is a cross-sectional view of the memory region MR and the staircase region SR of the memory device 100 respectively taken along line BS-BS' and line BM-BM' in FIG. 1A. Referring to FIGS. 1A and 1B, a plurality of sacrificial material layers 120 and a plurality of dielectric layers 130 are formed interlaced and stacked on a substrate 110. The sacrificial material layers 120 and the dielectric layers 130 extend along a plane defined by a first direction D1 and a second direction D2, in which the first direction D1 is perpendicular to the second direction D2. The sacrificial material layers 120 and the dielectric layers 130 are sequentially arranged on the substrate 110, and a bottommost layer of the sacrificial material layers 120 closest to the substrate 110 directly in contact with the substrate 110. In some embodiments, the substrate 110 is a semiconductor substrate, such as a silicon substrate, a silicon germanium substrate, a silicon carbide substrate, or the like. The substrate 110 may include interconnect structures having conductive contacts, transistors, or other similar components. The substrate 110 may include a conductive layer (e.g., a common source line). Accordingly, memory structures (e.g., memory structures MS in FIGS. 4A and 4B) to be subsequently formed can be connected to the conductive layer or other components in the substrate 110. In some embodiments, the sacrificial material layers 120 and the dielectric layers 130 include different materials. For example, the sacrificial material layers 120 include nitride (e.g., silicon nitride), while the dielectric layers 130 include oxide (e.g., silicon oxide).

After forming the alternately stacked sacrificial material layers 120 and the dielectric layers 130 on the substrate 110, recesses R1 are formed downwards penetrates through at least one of the dielectric layers 130 and at least one of the sacrificial material layers 120. A sidewall and a bottom surface connected to the sidewall of each of the recesses R1 are exposed. For example, each of the recesses R1 penetrates through three dielectric layers 130 and two sacrificial material layers 120, but the present disclosure is not limited in this regard. In some embodiments, a patterned photoresist is formed on a topmost layer of the dielectric layers 130, in which the patterned photoresist may be formed by suitable deposition, development and/or etching techniques. Then, the dielectric layers 130 and the sacrificial material layers 120 not covered by the patterned photoresist are etched by using the patterned photoresist as an etching mask to form the recesses R1. After the recesses R1 are formed, the patterned photoresist may be removed by using a photoresist stripping process (e.g., ashing process). As shown in FIG. 1A, each of the recesses R1 may extend from the memory region MR to the staircase region SR. The recesses R1 may define profiles of select gate structures to be subsequently formed. Each of the recesses R1 has a rectangular profile in the memory region MR, and has a protruding portion at an end of the staircase region SR for accommodating a select gate contact to be subsequently formed. Each of the recesses R1 may extend along the first direction D1. In some embodiments, the recesses R1 may be formed in parallel with each other along the first direction D1, for example, three first recesses R1 may be arranged along the second direction D2 at intervals, and each of the first recesses R1 extends along the first direction D1.

Figures 2A, 2B:
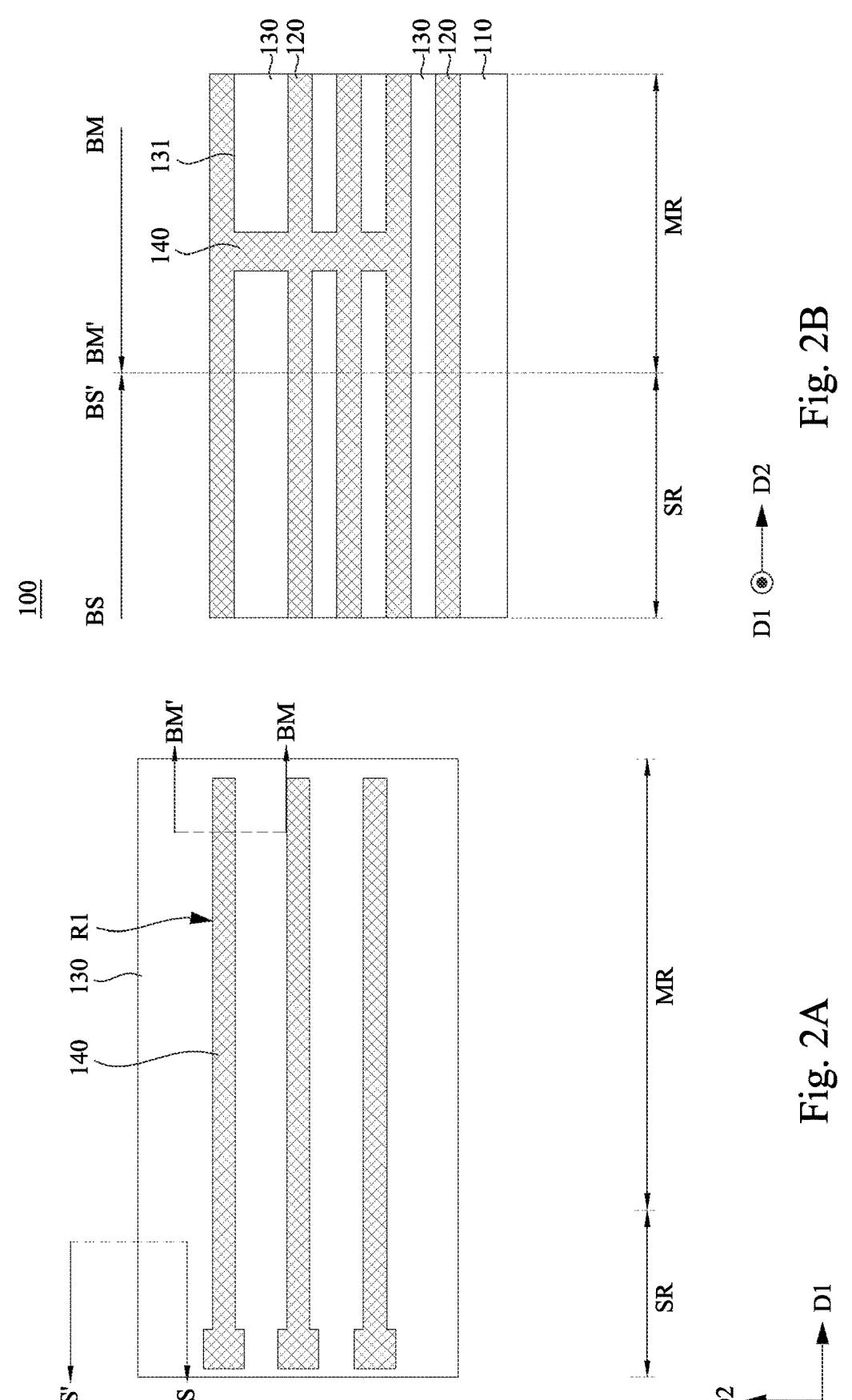

FIG. 2A is a top view of a step of manufacturing the memory device 100, and FIG. 2B is a cross-sectional view of the memory region MR and the staircase region SR of the memory device 100 respectively taken along line BS-BS' and line BM-BM' in FIG. 2A. Referring to FIGS. 2A and 2B, after forming the recesses R1, dielectric materials are filled in the recesses R1 to form sacrificial structures 140 downwards penetrating through at least one of the sacrificial material layers 120 and at least one of the dielectric layers 130. Furthermore, the sacrificial structures 140 are further formed on the topmost layer of the dielectric layers 130. In other words, a top surface 131 of the topmost layer of the dielectric layers 130 is covered by the sacrificial structures 140. In some embodiments, the sacrificial structures 140 and the sacrificial material layers 120 include the same materials, and thus there is no interface between the sacrificial structures 140 and the sacrificial material layers 120. For example, the sacrificial structures 140 and the sacrificial material layers 120 include nitride (e.g., silicon nitride).

Figures 3A, 3B:
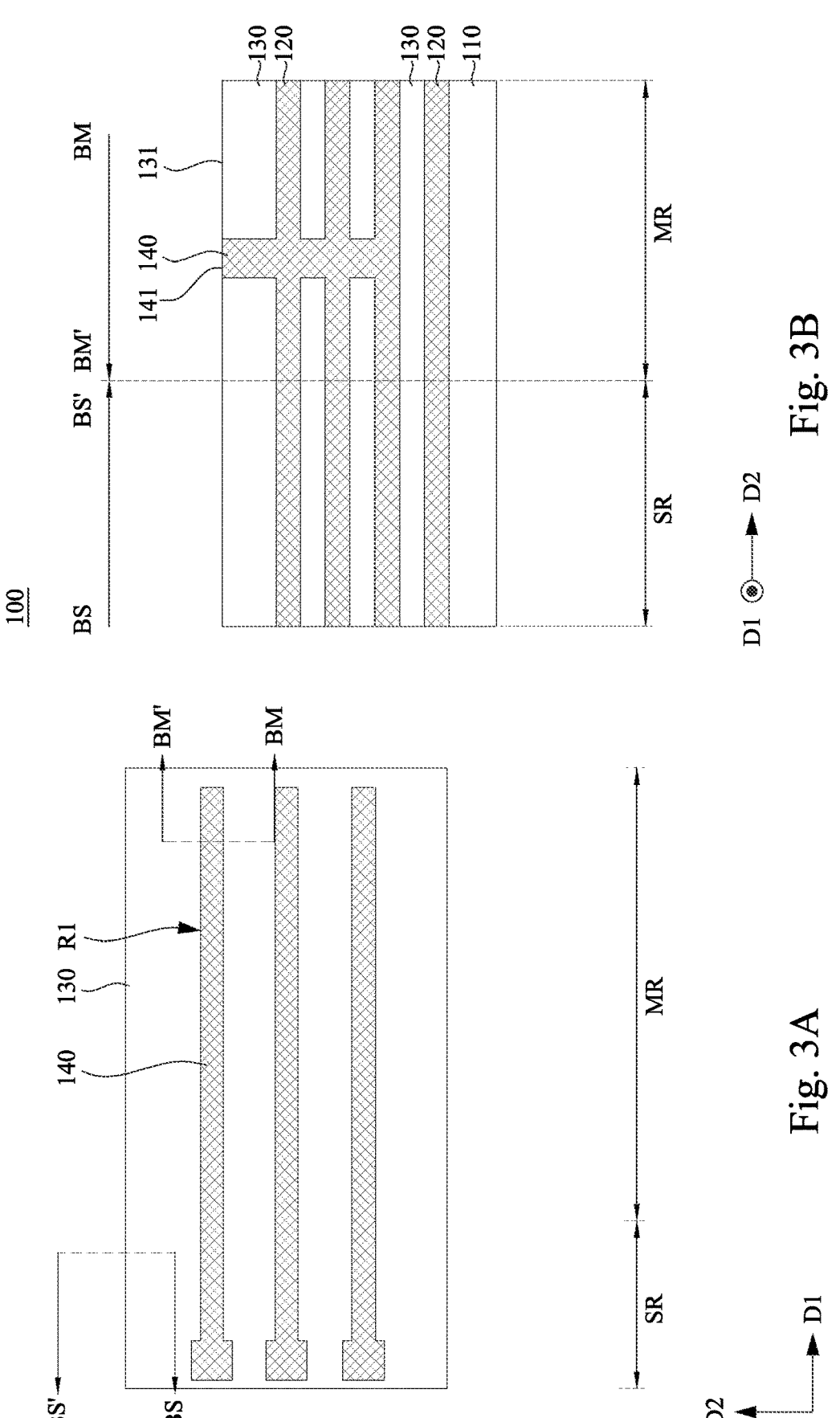

FIG. 3A is a top view of a step of manufacturing the memory device 100, and FIG. 3B is a cross-sectional view of the memory region MR and the staircase region SR of the memory device 100 respectively taken along line BS-BS' and line BM-BM' in FIG. 3A. Referring to FIGS. 3A and 3B, a planarization process is performed to remove excess portions of the sacrificial structures 140 above the top surface 131 of the topmost layer of the dielectric layers 130 such that the top surface 131 of the topmost layer of the dielectric layers 130 is substantially coplanar with the top surface 141 of the sacrificial structures 140. The planarization process may be a chemical mechanical planarization (CMP) process. In some embodiments, the sacrificial structures 140 downwards penetrate through at least one of the sacrificial material layers 120 and at least one of the dielectric layers 130.

Figures 4A, 4B:
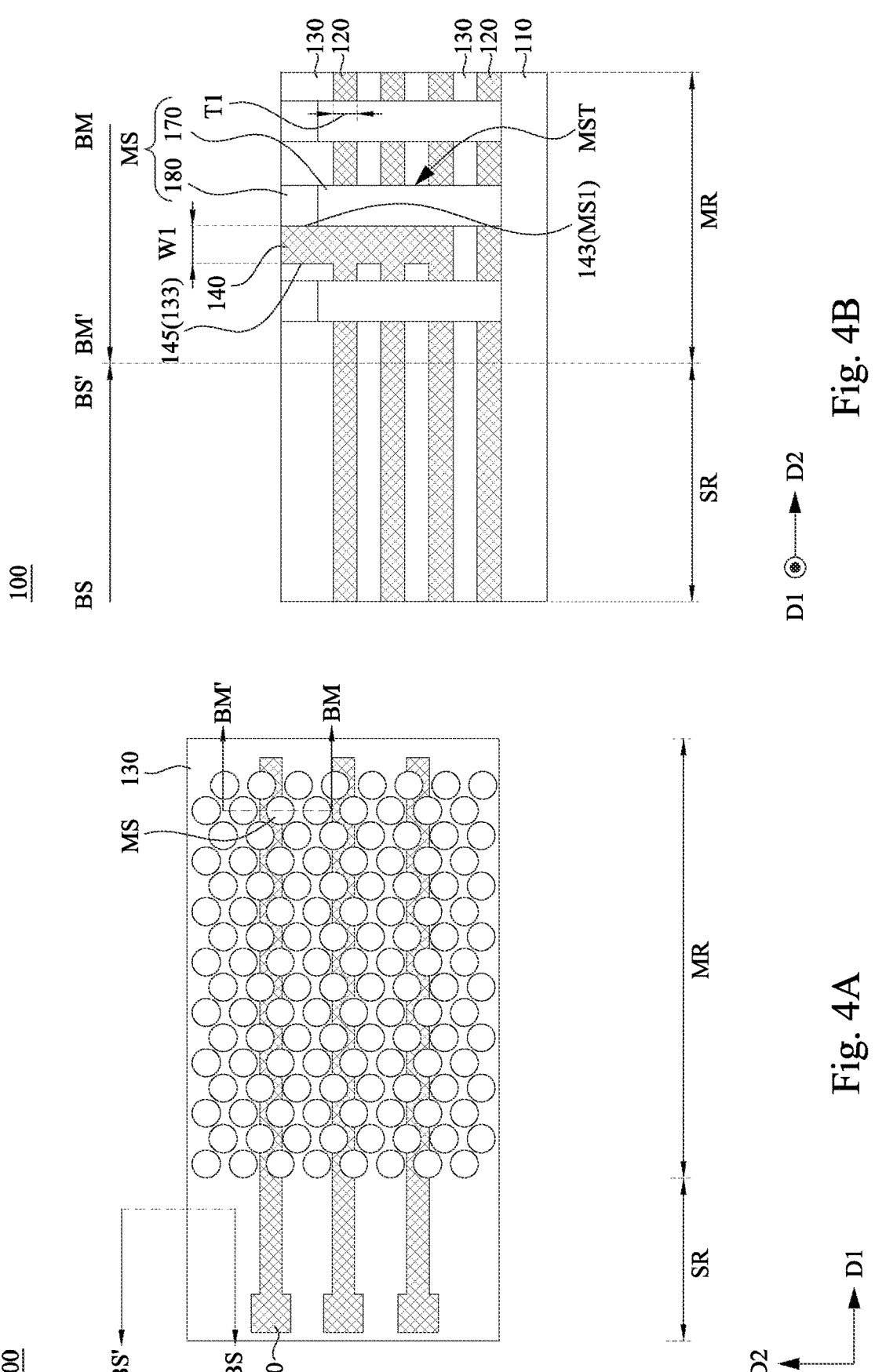

FIG. 4A is a top view of a step of manufacturing the memory device 100, and FIG. 4B is a cross-sectional view of the memory region MR and the staircase region SR of the memory device 100 respectively taken along line BS-BS' and line BM-BM' in FIG. 4A. Referring to FIGS. 4A and 4B, a plurality of memory structures MS are formed downwards penetrating through the sacrificial material layers 120 and the dielectric layers 130 in the memory region MR. Each of the memory structures MS includes a channel structure 170 and a conductive plug 180 on the channel structure 170. In some embodiments, as shown in FIG. 4B, the sacrificial structure 140 is in contact with one of the memory structures MS. In some embodiments, as shown in FIG. 4B, the sacrificial structure 140 has a width W1 along the second direction D2, and the width W1 is greater than a thickness T1 of one of the sacrificial material layers 120 along a vertical direction of the second direction D2 (i.e., a direction perpendicular to the second direction D2). Therefore, a conductive material structure to be subsequently formed (see conductive material structure 220 in FIG. 8B) will have a void for beneficial to perform the respective etching process, which will be discussed in the following description. In some embodiments, as shown in FIG. 4B, the width W1 of the sacrificial structure 140 is in a range of about 20 nm to about 80 nm, and the thickness T1 of one of the sacrificial material layer 120 (e.g., the sacrificial material layer 120 in contact with the sacrificial structure 140) is in a range of about 20 nm to about 35 nm. In some embodiments, a ratio of the width W1 of the sacrificial structure 140 to the thickness T1 of the sacrificial material layer 120 is in a range of about 1 to about 4. In some embodiments, as shown in FIG. 4B, the sacrificial structure 140 has a first sidewall 143 and a second sidewall 145 opposite to the first sidewall 143 in the dielectric layers 130. The first sidewall 143 of the sacrificial structure 140 is in contact with one of the memory structures MS, while the second sidewall 145 is spaced apart from the memory structures MS and is in contact with the dielectric layers 130. The width W1 may be referred as a minimum distance between the first sidewall 143 and the second sidewall 145. In other words, the topmost layer of the dielectric layers 130 has a sidewall 133 spaced apart from the memory structures MS, and the minimum distance between the sidewall 133 of the topmost layer of the dielectric layers 130 and the sidewall MS1 of one of the memory structures MS in contact with the sacrificial structure 140 is equal to the width W1. A ratio of the minimum distance (i.e., width W1 of the sacrificial structure 140) to the thickness T1 of the sacrificial material layer 120 is in a range of about 1 to about 4. In some embodiments, the memory structures MS are formed after forming the sacrificial structures 140 (or the recesses R1 defining the profiles of the select gate structures shown in FIGS. 2A and 2B) so as to prevent the memory structures MS from being damaged.

Figure 20:
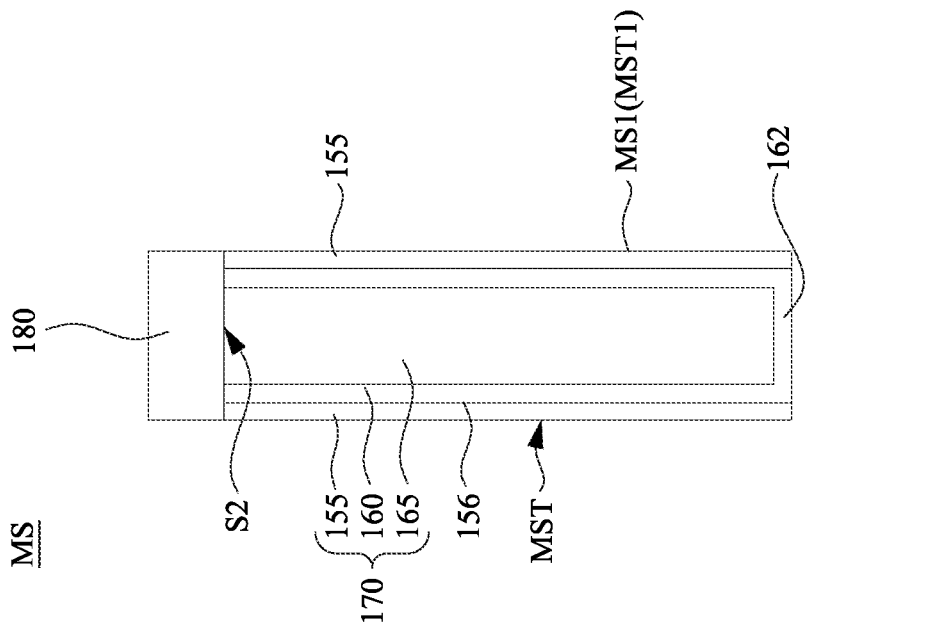
FIG. 20 illustrates a detailed structure diagram of a memory structure of the memory device according to some embodiments of the present disclosure.

FIG. 20 illustrates a detailed structure diagram of a memory structure MS according to some embodiments of the present disclosure. In some embodiments, as shown in FIGS. 4A, 4B and 20, forming the memory structure MS includes the following steps. An opening MST is formed downwards penetrating through the sacrificial material layers 120 and the dielectric layers 130 such that the substrate 110 is exposed. A memory structure layer 155 is formed on opposite sidewalls MST1 of the opening MST, but the opening MST is still not filled by the memory structure layer 155. In some embodiments, forming the memory structure layer 155 includes forming a dielectric layer on the sidewall MST1 and a bottom of the opening MST to cover the substrate 110, and then etching a bottom portion of the dielectric layer on the bottom of the opening MST to form the memory structure layer 155, such that the substrate 110 is exposed again. A channel layer 160 is then formed on a sidewall 156 of the memory structure layer 155 and the bottom of the opening MST, but the opening MST is still not filled by the channel layer 160. The channel layer 160 covers and is in contact with the substrate 110. Thereafter, a dielectric material is filled in the opening MST to form a dielectric structure 165 on the channel layer 160, in which the channel layer 160 includes a portion 162 directly below the dielectric structure 165. In other words, the portion 162 of the channel layer 160 is in contact with the substrate 110. Therefore, a channel structure 170 including the memory structure layer 155, the channel layer 160 and the dielectric structure 165 is formed.

After forming the channel structure 170, the memory structure layer 155, the channel layer 160 and the dielectric structure 165 are recessed to form a space S2, such that a top surface of the channel structure 170 is below the top surface of the topmost layer of the dielectric layers 130. The memory structure layer 155, the channel layer 160 and the dielectric structure 165 are recessed by performing a wet etching process, a dry etching process or a combination thereof. Then, a conductive material is filled in the space S2 to form the conductive plug 180 on the channel structure 170. In other words, a top surface of the conductive plug 180 is substantially coplanar with the top surface of the topmost layer of the dielectric layers 130. Therefore, the memory structure MS including the channel structure 170 (including the memory structure layer 155, the channel layer 160 and the dielectric structure 165) and the conductive plug 180 is formed in the opening MST.

In some embodiments, the memory structure layer 155 includes a blocking layer, a memory storage layer and a tunneling layer. The blocking layer is disposed on the sidewalls of the sacrificial material layers 120 and the sidewalls of dielectric layers 130, the memory storage layer is disposed on the blocking layer, and the tunneling layer is disposed on the memory storage layer. The blocking layer and the tunneling layer may include oxide (e.g., silicon oxide) or other suitable dielectric materials, and the memory storage layer may include nitride (e.g., silicon nitride) or other material that is able to trap electrons. Accordingly, the memory structure layer 155 may be a three-layer structure of an oxide layer, a nitride layer and an oxide layer. The channel layer 160 may include polysilicon or other suitable semiconductor materials. The dielectric structure 165 may include oxide (e.g., silicon oxide) or other suitable dielectric materials. The conductive plug 180 may include polysilicon or other suitable semiconductor materials. The conductive plug 180 and the channel layer 160 may include the same material, such as polysilicon. It is noted that the channel structure 170 is shown in FIG. 4B (and subsequent figures) and the detailed structure of the channel structure 170 is illustrated in FIG. 20 for the purpose of simplicity and clarity. In some embodiments, forming the opening MST further includes etching a portion of the sacrificial structure 140 such that the sacrificial structure 140 is in contact with the memory structure MS formed in the opening MST.

Figures 5A, 5B:
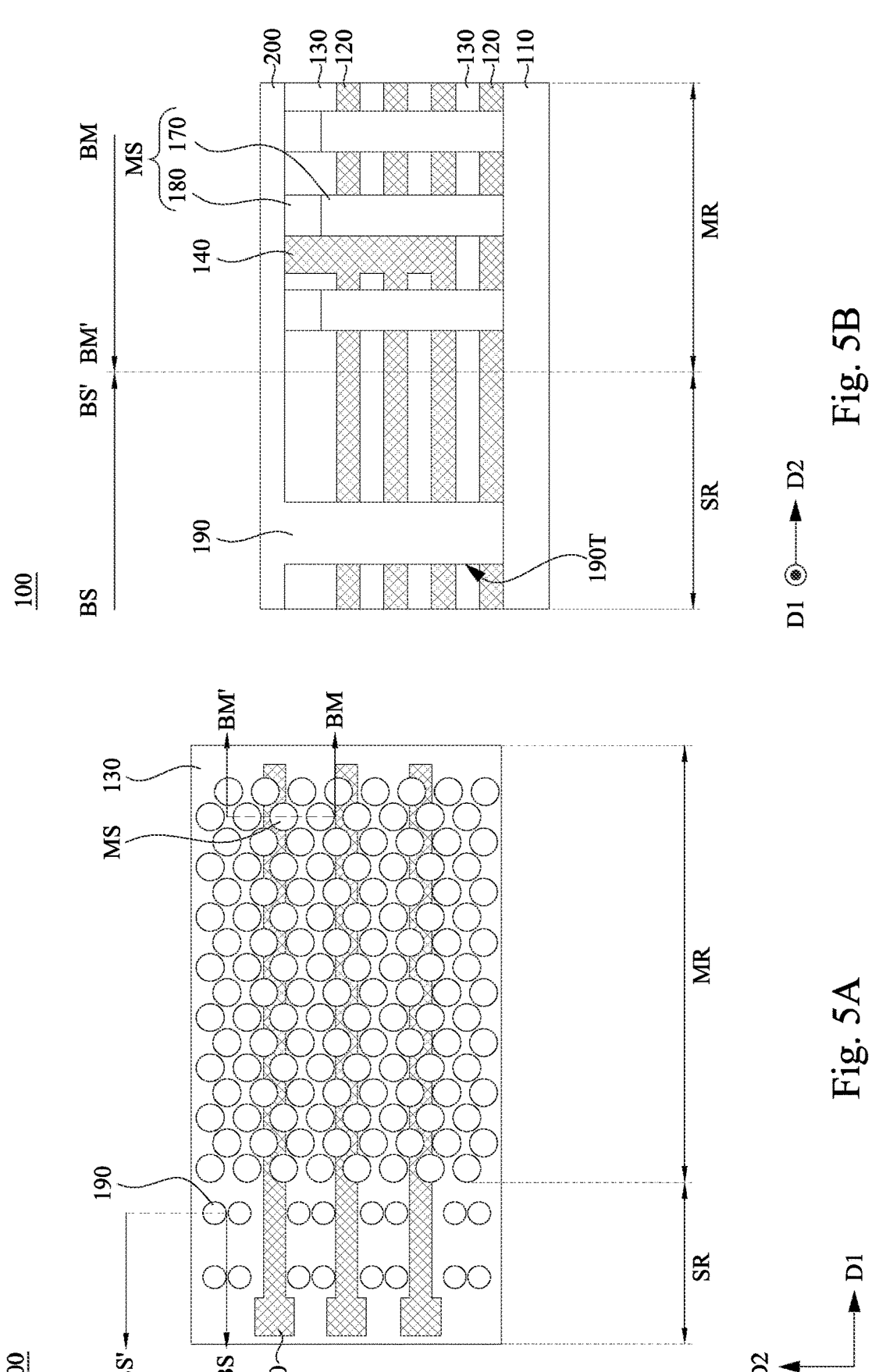

FIG. 5A is a top view of a step of manufacturing the memory device 100, and FIG. 5B is a cross-sectional view of the memory region MR and the staircase region SR of the memory device 100 respectively taken along line BS-BS' and line BM-BM' in FIG. 5A. Referring to FIGS. 5A and 5B, after forming the memory structures MS, pillar structures 190 and an isolation layer 200 are formed over the substrate 110. In greater details, the sacrificial material layers 120 and the dielectric layers 130 in the staircase region SR are etched in advance to form holes 190T exposing the substrate 110. Then, dielectric materials are filled in the holes 190T to form the pillar structures 190. Furthermore, the isolation layer 200 is formed on the topmost layer of the dielectric layers 130. In some embodiments, forming the pillar structures 190 and forming the isolation layer 200 are performed by using one deposition process. In other words, the pillar structures 190 and the isolation layer 200 include the same material, and thus there is no interface between top surfaces of the pillar structures 190 and the isolation layer 200. In some embodiments, the pillar structures 190 and the isolation layer 200 include oxide (e.g., silicon oxide) or other suitable dielectric materials. In some embodiments, the pillar structures 190, the isolation layer 200 and the dielectric layers 130 include the same material, such as oxide.

Figures 6A, 6B:
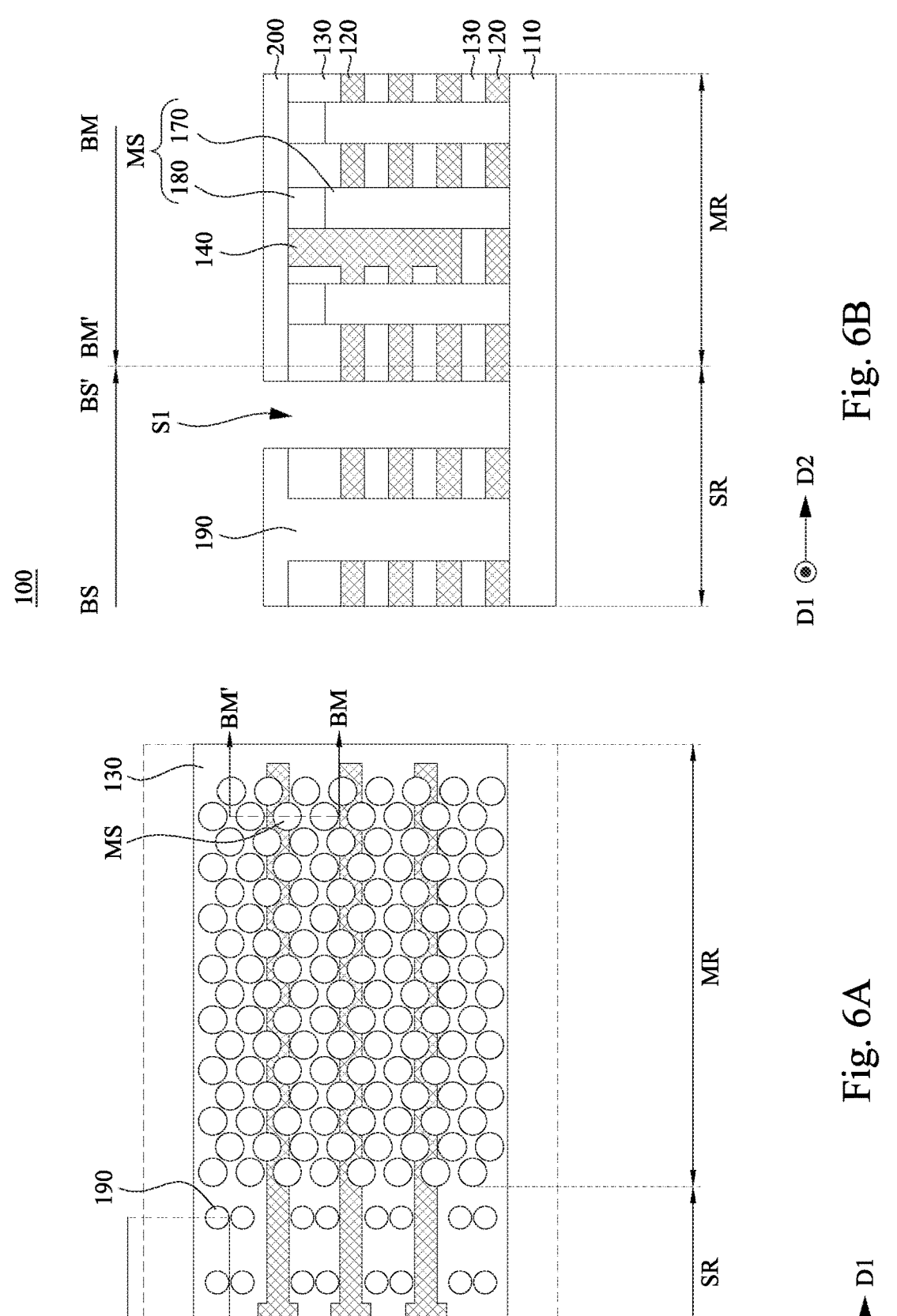

FIG. 6A is a top view of a step of manufacturing the memory device 100, and FIG. 6B is a cross-sectional view of the memory region MR and the staircase region SR of the memory device 100 respectively taken along line BS-BS' and line BM-BM' in FIG. 6A. Referring to FIGS. 6A and 6B, after forming the pillar structures 190 and the isolation layer 200, the sacrificial material layers 120 and the dielectric layers 130 are etched to form a slit trench S1 downwards penetrating through the sacrificial material layers 120 and the dielectric layers 130. In some embodiments, the slit trench S1 exposes the substrate 110 and is spaced apart from the sacrificial structures 140. In some embodiments, as shown in FIG. 6A, each of the slit trench S1 extends (along the first direction D1) between the memory region MR and the staircase region SR.

Figures 7A, 7B:
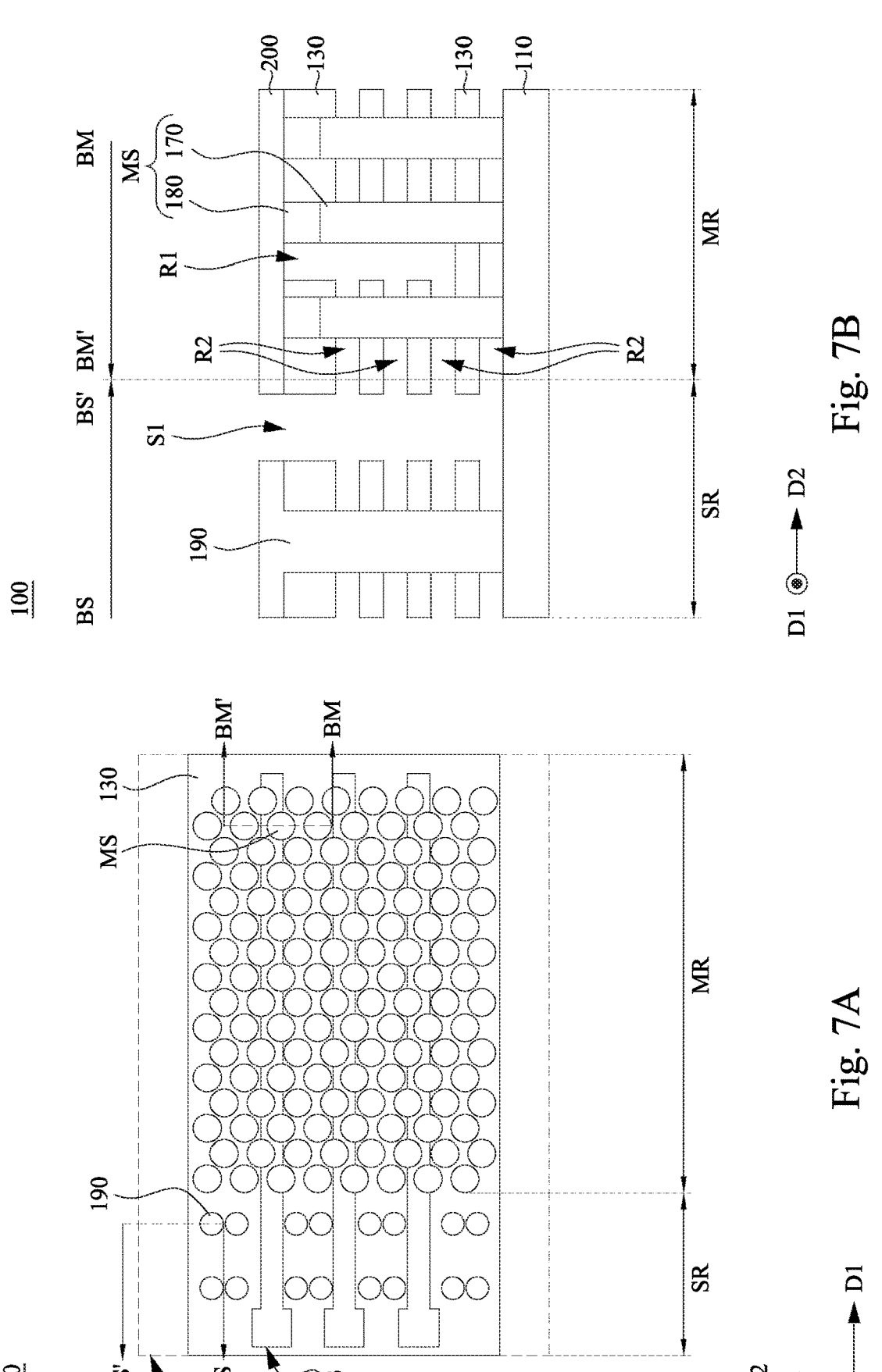

FIG. 7A is a top view of a step of manufacturing the memory device 100, and FIG. 7B is a cross-sectional view of the memory region MR and the staircase region SR of the memory device 100 respectively taken along line BS-BS' and line BM-BM' in FIG. 7A. Referring to FIGS. 6A to 7B, after forming the slit trench S1, an entirety of the sacrificial material layers 120 is removed to form recesses R2 and an entirety of the sacrificial structures 140 are removed to form the recesses R1 again. In some embodiments, as shown in FIG. 7B, the recesses R2 are communicated with the recess R1 and the slit trench S1. In some embodiments, removing the sacrificial material layers 120 and removing the sacrificial structures 140 are performed such that a sidewall and a bottom surface of the topmost layer of the dielectric layers 130 are exposed and the sidewalls of the memory structure MS are exposed. In some embodiments, removing the sacrificial material layer 120 and removing the sacrificial structures 140 are performed by using a selective etching process. Since the sacrificial material layers 120 and the sacrificial structures 140 include the same material (e.g., nitride or silicon nitride), the sacrificial material layers 120 and the sacrificial structures 140 may be removed in the same (or single) etching process without leaving the sacrificial material layers 120 remained. In some embodiments, the sacrificial material layers 120 and the sacrificial structures 140 are removed using a wet etching process, in which the wet etching process may use phosphoric acid solution or other suitable acidic etching solutions. In some embodiments, the pillar structures 190 provide the structural support to prevent the memory device 100 from collapsing during the removal of the sacrificial material layers 120 and the sacrificial structures 140.

Figures 8A, 8B:
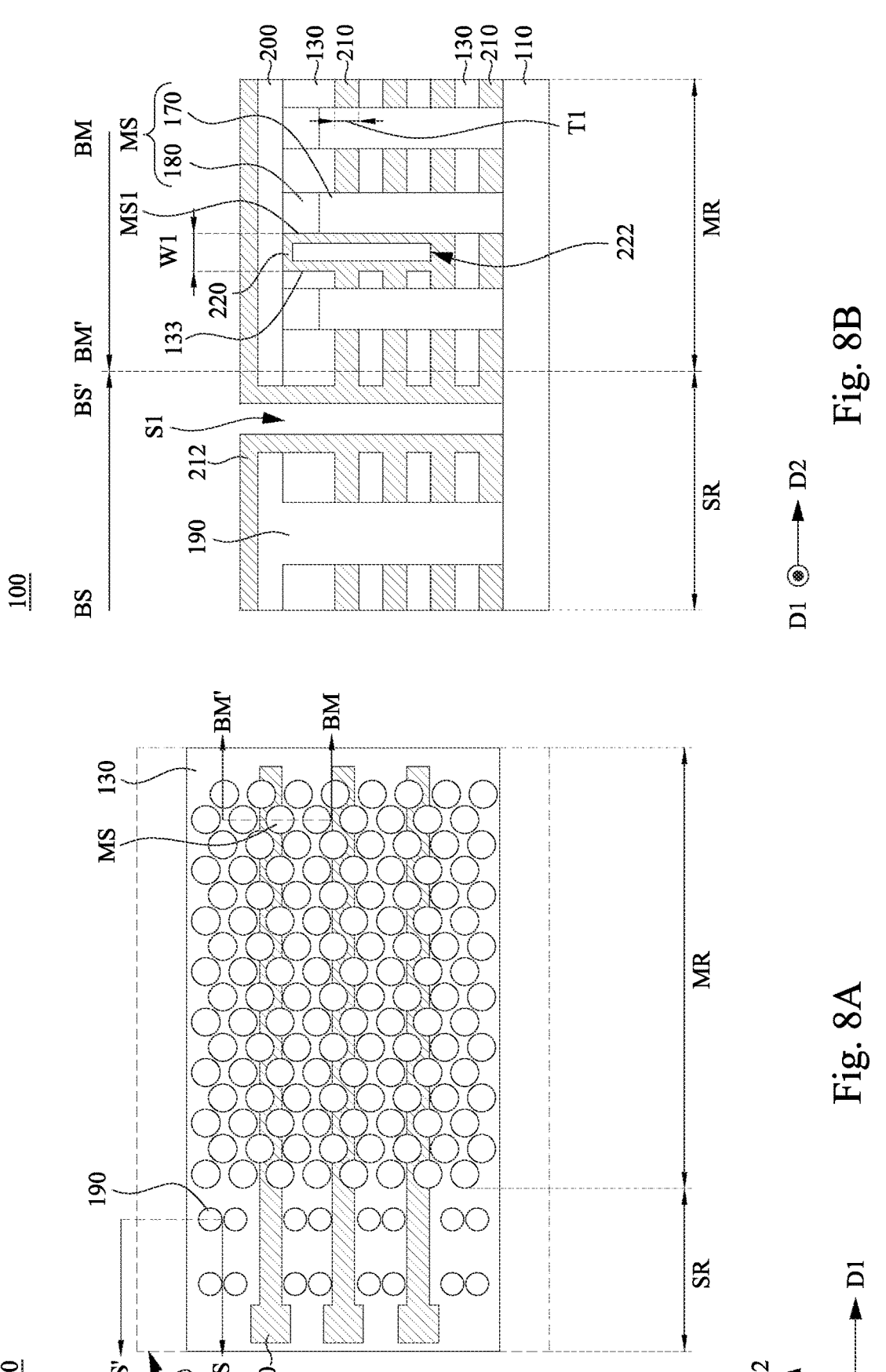

FIG. 8A is a top view of a step of manufacturing the memory device 100, and FIG. 8B is a cross-sectional view of the memory region MR and the staircase region SR of the memory device 100 respectively taken along line BS-BS' and line BM-BM' in FIG. 8A. Referring to FIGS. 8A to 8B, the sacrificial material layers 120 and the sacrificial structures 140 are respectively replaced with a plurality of conductive layers 210 and conductive material structures 220, in which each of the conductive material structures 220 has a void 222. In greater details, conductive materials are filled in the recesses R2 to form the conductive layers 210, and the conductive materials are filled in the recesses R1 to form the conductive material structures 220. Furthermore, the conductive layers 210 further include an excess portion 212 located on two opposite sidewalls of the slit trench S1 (and/or a bottom of the slit trench S1) and on a top surface of the isolation layer 200. In some embodiments, filling the conductive material to form the conductive layers 210 and the conductive material structures 220 is performed by using one deposition process. For example, a chemical vapor deposition, an atomic layer deposition, a physical vapor deposition, an electroless plating process, or other suitable deposition processes can be used. Since forming the conductive layers 210 and forming the conductive material structures 220 are performed by using one deposition process, the conductive layers 210 and the conductive material structures 220 may include the same conductive material. Therefore, there may be no interface between the conductive layers 210 and the conductive material structures 220. In some embodiments, the conductive layers 210 and the conductive material structures 220 include metal, such as tungsten. The conductive layers 210 may be referred to as word lines or gate layers. Specifically, the conductive layers 210 may be used as control gate electrodes of the memory device 100 (in particular with a vertical NAND memory device).

In some embodiments, as shown in FIG. 8B, the conductive material structure 220 has a width W1 along the second direction D2. The width W1 is equal to a distance between the sidewall 133 of the topmost layer of the dielectric layers 130 and the sidewall MS1 of one of the memory structures MS, in which the sidewall 133 and the sidewall MS1 are respectively in contact with two opposite sidewalls of the conductive material structure 220. Each of the conductive layers 210 has a thickness T1 between the dielectric layers 130. Since the width W1 of the conductive material structure 220 is greater than the thickness T1 of each of the conductive layers 210 (i.e., the width W1 of the sacrificial structure 140 is greater than the thickness T1 of each of the sacrificial material layer 120 as shown in FIG. 4B), the conductive material structure 220 has a void 222. Therefore, an etching process (i.e., removing the conductive material structure 220) to be subsequently performed would be easier and the etching process would not produce residues on the dielectric layers 130.

Figures 9A, 9B:
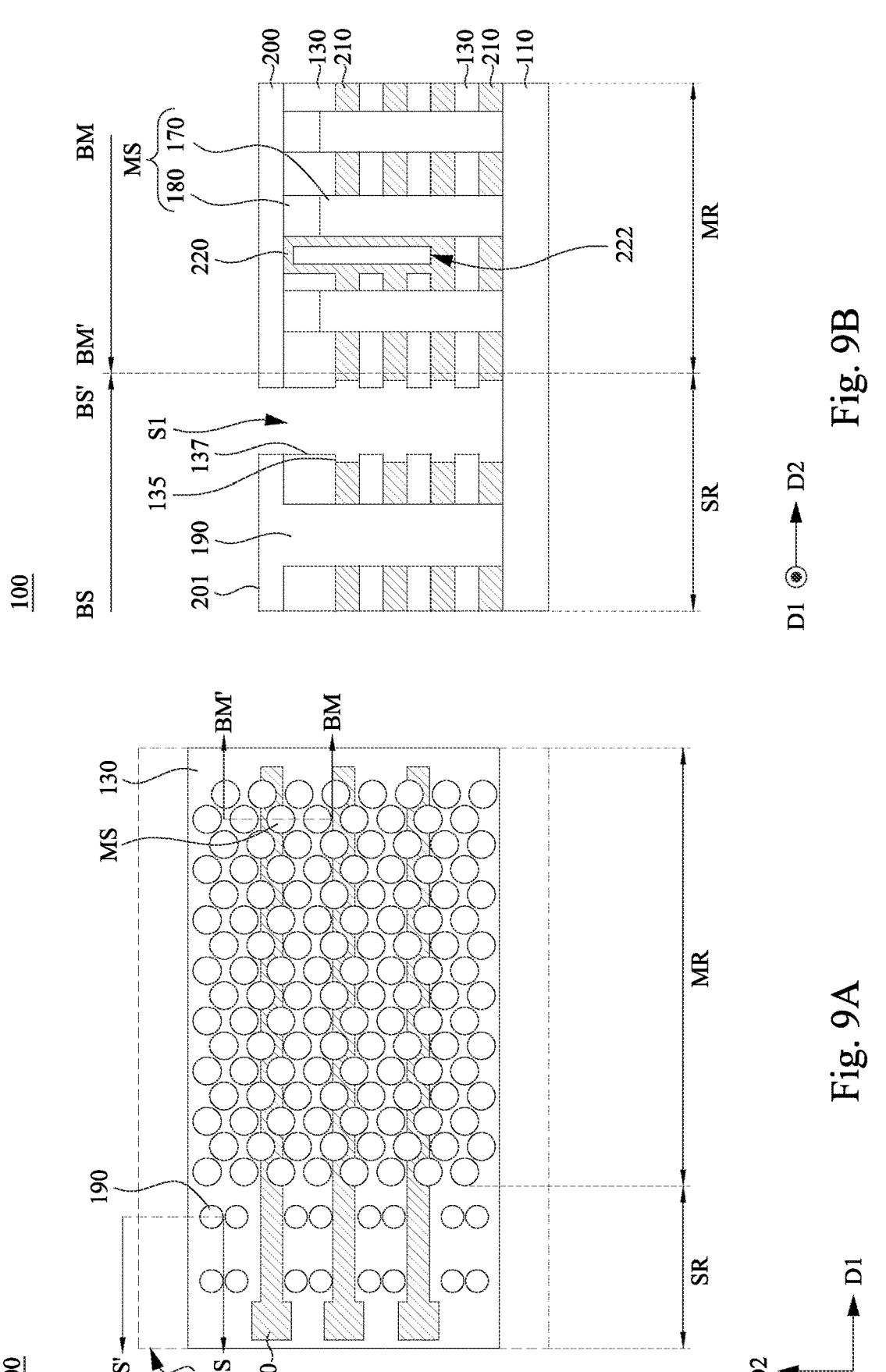

FIG. 9A is a top view of a step of manufacturing the memory device 100, and FIG. 9B is a cross-sectional view of the memory region MR and the staircase region SR of the memory device 100 respectively taken along line BS-BS' and line BM-BM' in FIG. 9A. Referring to FIGS. 9A and 9B, after forming the conductive layers 210 and the conductive material structures 220, an etching-back process is performed to remove the excess portion 212 of the conductive layers 210 on the sidewalls of the slit trench S1 and above the isolation layer 200, such that the top surface 201 of the isolation layer 200 is exposed. In some embodiments, as shown in FIG. 9B, the etching-back process is performed such that each of the dielectric layers 130 protrudes relatively outward (e.g., rightward or leftward) from the underlying conductive layer 210 in the slit trench S1. In other words, a bottom surface 135 and a sidewall 137 of the topmost layer of the dielectric layers 130 are exposed by the slit trench S1. Since the etching-back process is performed to remove the conductive layers 210 below the dielectric layers 130, adjacent layers of the conductive layers 210 can be avoided or prevented from contacting with each other, thereby the electric leakage can be avoided or prevented. In some embodiments, the etching-back process includes an isotropic wet etching process, an anisotropic dry etching process, or other suitable etching processes.

Figures 10A, 10B:
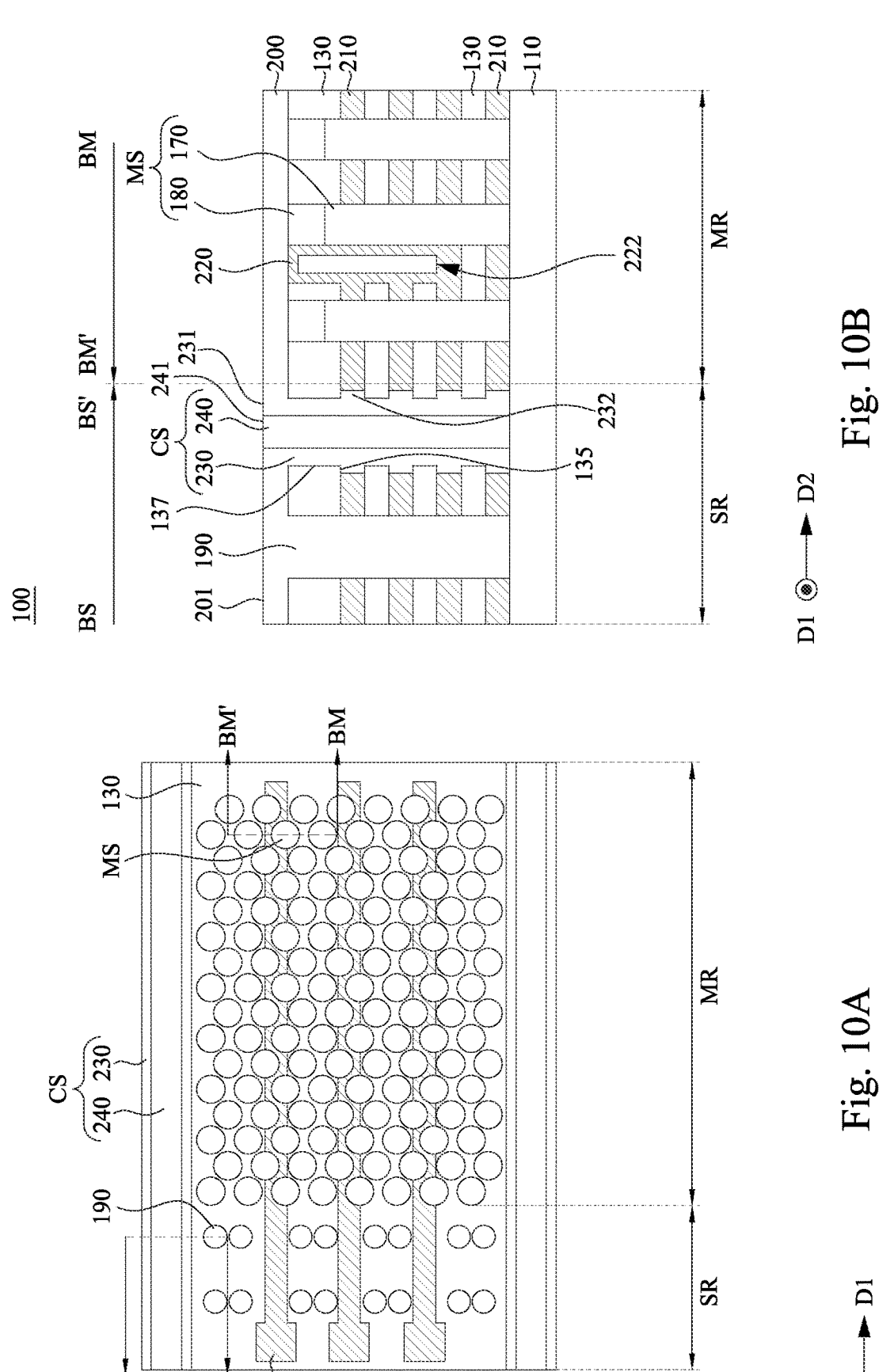

FIG. 10A is a top view of a step of manufacturing the memory device 100, and FIG. 10B is a cross-sectional view of the memory region MR and the staircase region SR of the memory device 100 respectively taken along line BS-BS' and line BM-BM' in FIG. 10A. Referring to FIGS. 10A and 10B, after the etching-back process is performed to expose the bottom surface 135 and the sidewall 137 of the topmost layer of the dielectric layers 130, a contact structure CS is formed in the slit trench S1. In greater details, a liner layer 230 may be formed in the slit trench S1 by using a deposition process, and then a conductive material is filled in the slit trench S1 to form a conductive structure 240. The liner layer 230 may be formed by using a chemical vapor deposition process, an atomic layer deposition process, a physical vapor deposition process or other suitable deposition processes. The liner layer 230 includes oxide (e.g., silicon oxide) or other suitable dielectric materials. In some embodiments, since the liner layer 230 and the isolation layer 200 include the same material (e.g., oxide), there is no interface between the liner layer 230 and the isolation layer 200. In some embodiments, the conductive structure 240 is formed by using a chemical vapor deposition process, an atomic layer deposition process, a physical vapor deposition process, or other suitable deposition processes. The conductive structure 240 may include semiconductor material (e.g., polysilicon), metal or other suitable conductive materials. In some other embodiments, the conductive structure 240 and the conductive plug 180 include the same material, such as polysilicon.

In some embodiments, a planarization process (e.g., a chemical mechanical polishing process) is performed to remove excess materials of the liner layer 230 and/or the conductive structure 240. For example, the isolation layer 200 serves as an etching stop layer for performing the planarization process, such that a top surface of the contact structure CS (i.e., a top surface 241 of the conductive structure 240 and a top surface 231 of the liner layer 230) is substantially coplanar with the top surface 201 of the isolation layer 200.

In some embodiments, the contact structure CS is disposed on the sidewalls of the conductive layers 210 and the sidewalls of the dielectric layers 130. In other words, the contact structure CS downwards penetrates through the conductive layers 210 and the dielectric layers 130. The contact structure CS includes the liner layer 230 and the conductive structure 240, in which the conductive structure 240 is surrounded by the liner layer 230. The bottom surface 135 and the sidewall 137 of the topmost layer of the dielectric layers 130 are in contact with the liner layer 230. In the vertical direction of the second direction D2, the liner layer 230 has a portion 232 directly between the dielectric layers 130, and the portion 232 of the liner layer 230 is in contact with the conductive layers 210. In some embodiments, the liner layer 230 is configured to separate the conductive structure 240 from the conductive layers 210 to avoid an electrical contact between the conductive structure 240 and the conductive layers 210. The conductive structure 240 of the contact structure CS is electrically connected to the conductive layer (e.g., a common source line) in the substrate 110.

Figures 11A, 11B:
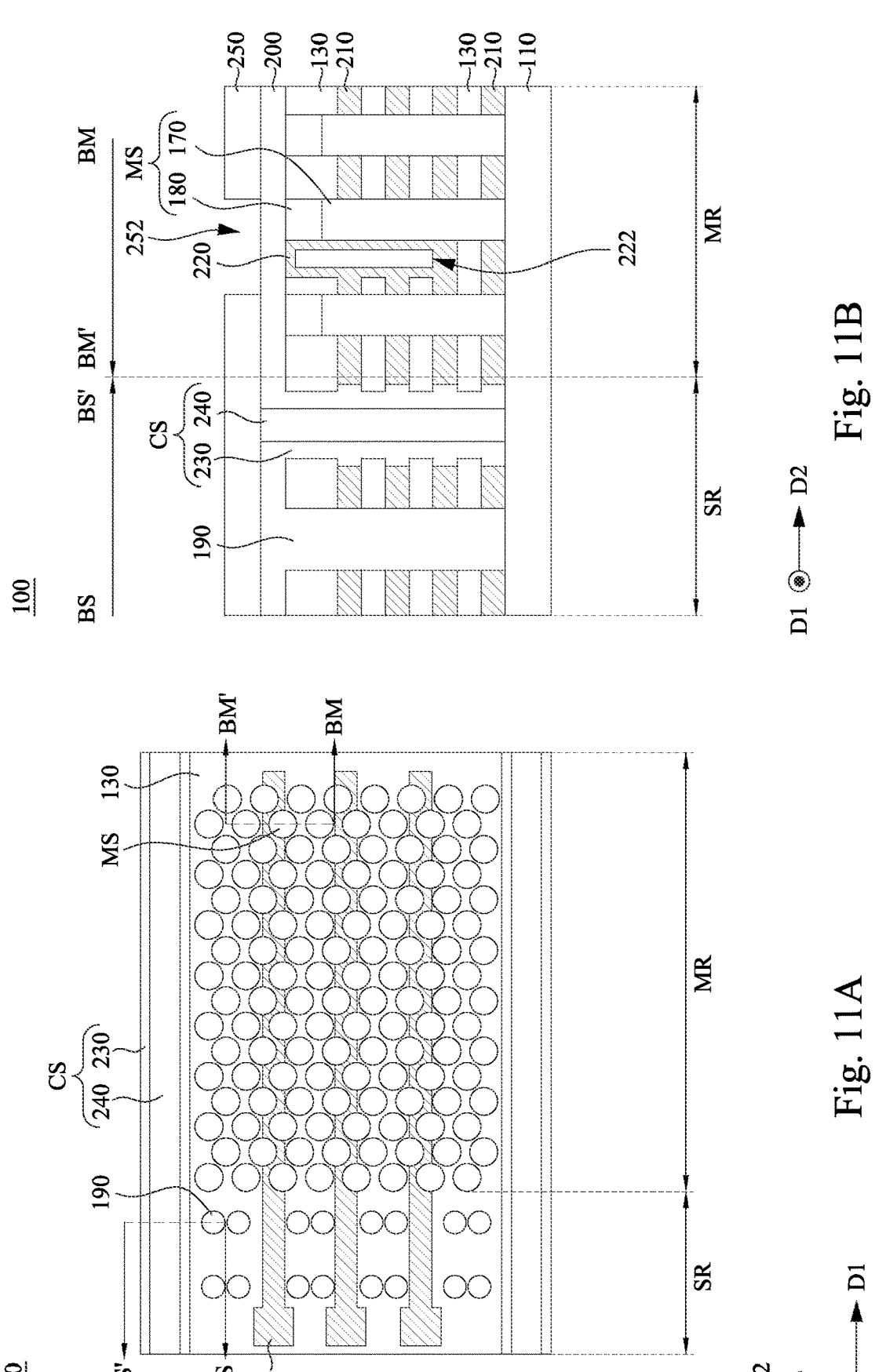

FIG. 11A is a top view of a step of manufacturing the memory device 100, and FIG. 11B is a cross-sectional view of the memory region MR and the staircase region SR of the memory device 100 respectively taken along line BS-BS' and line BM-BM' in FIG. 11A. Referring to FIGS. 11A and 11B, after forming the contact structure CS, a patterned photoresist 250 is formed on the isolation layer 200 and the contact structure CS to cover the contact structure CS. The patterned photoresist 250 has openings 252 exposing a portion of the isolation layer 200. Specifically, each of the openings 252 of the patterned photoresist 250 is located directly above the conductive material structure 220 and the memory structure MS in contact with the conductive material structure 220. The patterned photoresist 250 may be formed by using suitable deposition, development and/or etching techniques.

Figures 12A, 12B:
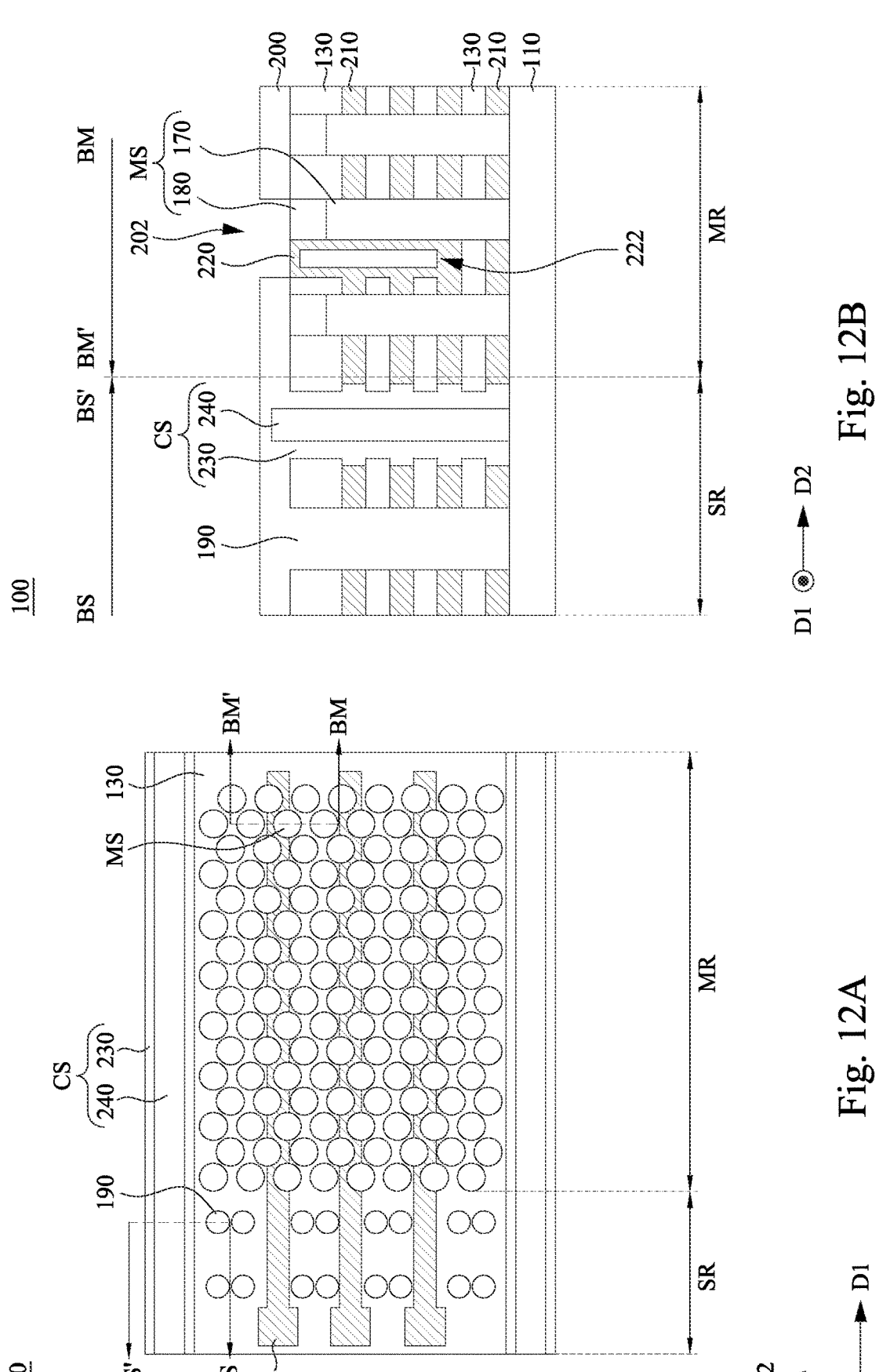

FIG. 12A is a top view of a step of manufacturing the memory device 100, and FIG. 12B is a cross-sectional view of the memory region MR and the staircase region SR of the memory device 100 respectively taken along line BS-BS' and line BM-BM' in FIG. 12A. Referring to FIGS. 11A to 12B, the isolation layer 200 not covered by the patterned photoresist 250 is etched by using the patterned photoresist 250 as an etching mask to form openings 202 in the isolation layer 200. As shown in FIG. 12B, the opening 202 of the isolation layer 200 exposes the conductive material structure 220 and the memory structure MS in contact with the conductive material structure 220. In some embodiments, after forming the openings 202 of the isolation layer 200, the patterned photoresist 250 is removed, in which an ashing process or an etching process may be used to remove the patterned photoresist 250.

Figures 13A, 13B:
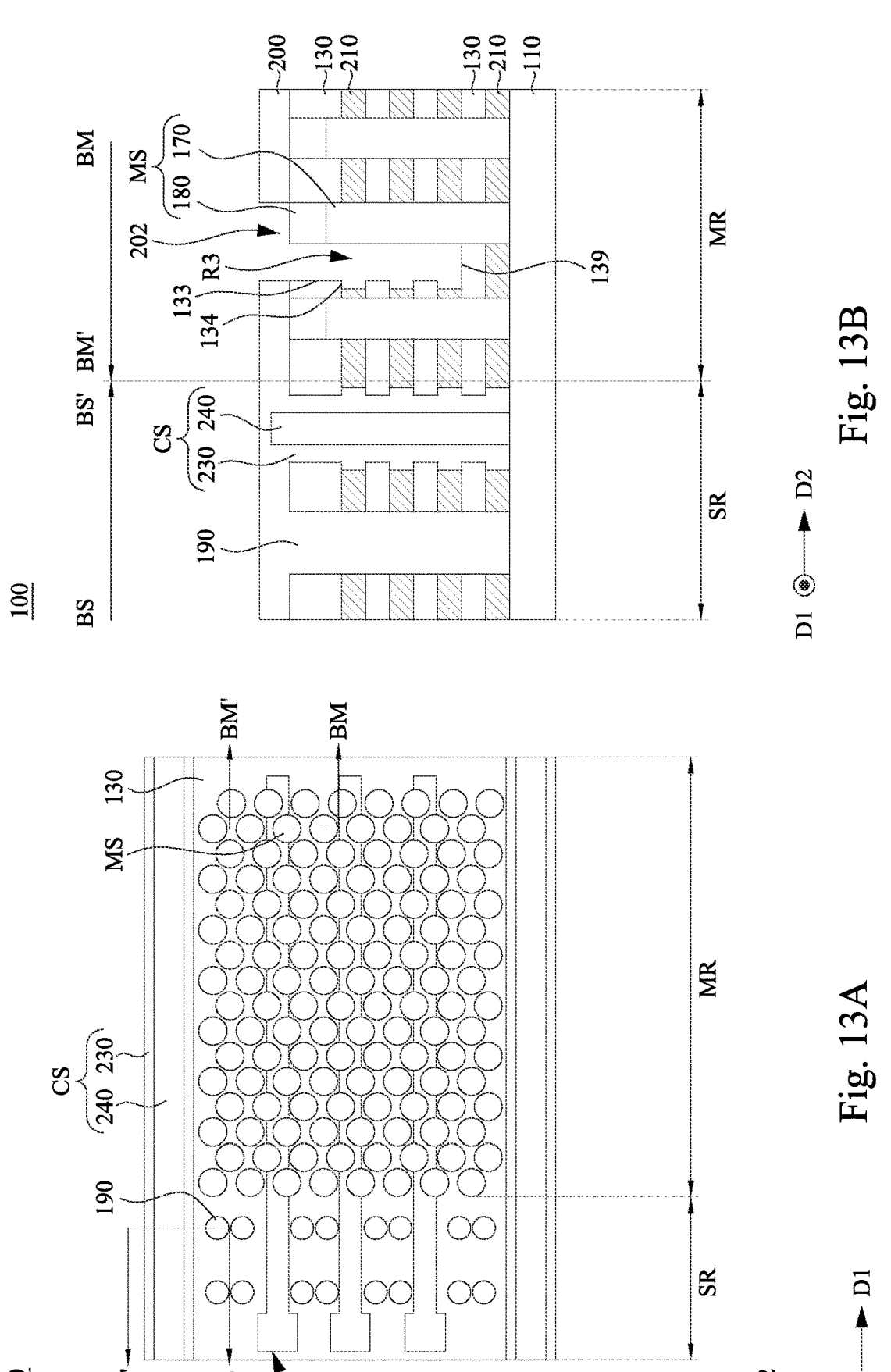

FIG. 13A is a top view of a step of manufacturing the memory device 100, and FIG. 13B is a cross-sectional view of the memory region MR and the staircase region SR of the memory device 100 respectively taken along line BS-BS' and line BM-BM' in FIG. 13A. Referring to FIGS. 12A to 13B, an etching-back process is performed to remove an entirety of the conductive material structures 220 and form recesses R3 exposing the top surface 139 of one of the dielectric layers 130, in which the recesses R3 is communicated with the openings 202 of the isolation layer 200. Each of the recesses R3 may be defined as a space for select gate structures to be subsequently formed (see select gate structures GS in FIG. 16B and FIG. 17B) to activate corresponding vertical NAND strings.

The void 222 of the conductive material structure 220 may be beneficial for removing the entirety of the conductive material structure 220 during the etching-back process. In other words, residues of the conductive material structure 220 can be avoided after performing the etching-back process. In contrast, if the conductive material structure 220 does not have the void 222 therein, the conductive material structure 220 would still remain on the top surface 139 of one of the dielectric layers 130 (i.e., remain on the bottom of the recess R3) after performing the etching-back process. In some embodiments, the etching-back process is performed such that a portion of the conductive layers 210 in contact with the conductive material structure 220 is etched. In other words, each of the dielectric layers 130 protrudes relatively outward (e.g., rightward) from the underlying conductive layer 210 in the recess R3. Stated differently, the sidewall 133 and the bottom surface 134 of the topmost layer of the dielectric layers 130 are exposed by the recess R3. Since the etching-back process is performed to etch the conductive layers 210 below the dielectric layers 130, adjacent layers of the conductive layers 210 can be avoided or prevented from contacting with each other, thereby the electric leakage can be avoided or prevented. In some embodiments, the etching-back process includes a wet etch process. The wet etching process may use an acidic etching solution.

Figures 14A, 14B:
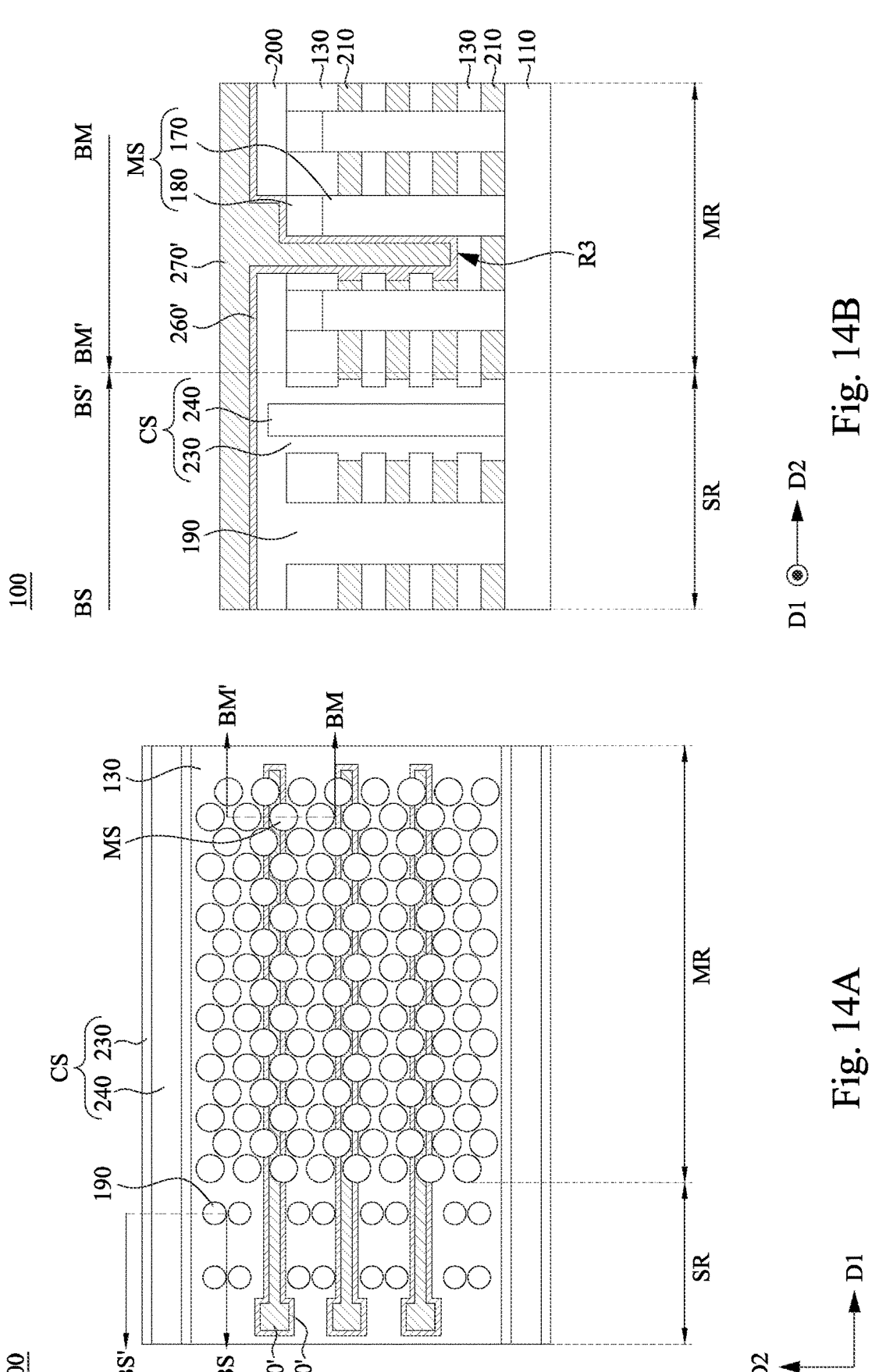

FIG. 14A is a top view of a step of manufacturing the memory device 100, and FIG. 14B is a cross-sectional view of the memory region MR and the staircase region SR of the memory device 100 respectively taken along line BS-BS' and line BM-BM' in FIG. 14A. Referring to FIGS. 13A to 14B, dielectric layers 260' are formed respectively in the recesses R3. In greater details, the dielectric layers 260' are formed on the sidewalls of the recess R3, the sidewalls and the top surface of the isolation layer 200. Furthermore, the dielectric layers 260' can be formed on the sidewall and top surface of the memory structure MS adjacent to the recesses R3. The dielectric layers 260' may be formed by using a deposition process, such as a chemical vapor deposition process, an atomic layer deposition process, a physical vapor deposition process, or other suitable deposition processes. The dielectric layers 260' may include oxide. Specifically, the dielectric layers 260' include tetraethylorthosilicate (TEOS) oxide and/or dielectric metal oxide (e.g., aluminum oxide or hafnium oxide), or any other suitable dielectric metal oxide material. The dielectric layers 260' will be patterned in subsequent steps to serve as a select gate dielectric layer.

After forming the dielectric layers 260', conductive material layers 270' are respectively formed on the dielectric layers 260'. The conductive material layers 270' respectively fill in the recess R3. In some embodiments, the conductive material layers 270' are formed by using a chemical vapor deposition process, an atomic layer deposition process, a physical vapor deposition process, or other suitable deposition processes. The conductive material layers 270' may include metal (e.g., tungsten), semiconductor material (e.g., polysilicon) or other suitable conductive materials. The conductive material layers 270' will be patterned in subsequent steps to serve as select gate electrodes. In some embodiments, the conductive material layers 270' and the conductive layers 210 include the same material, such as tungsten. In some embodiments, the conductive material layers 270' are separated from the conductive layers 210 by the dielectric layer 260'.

Figures 15A, 15B:
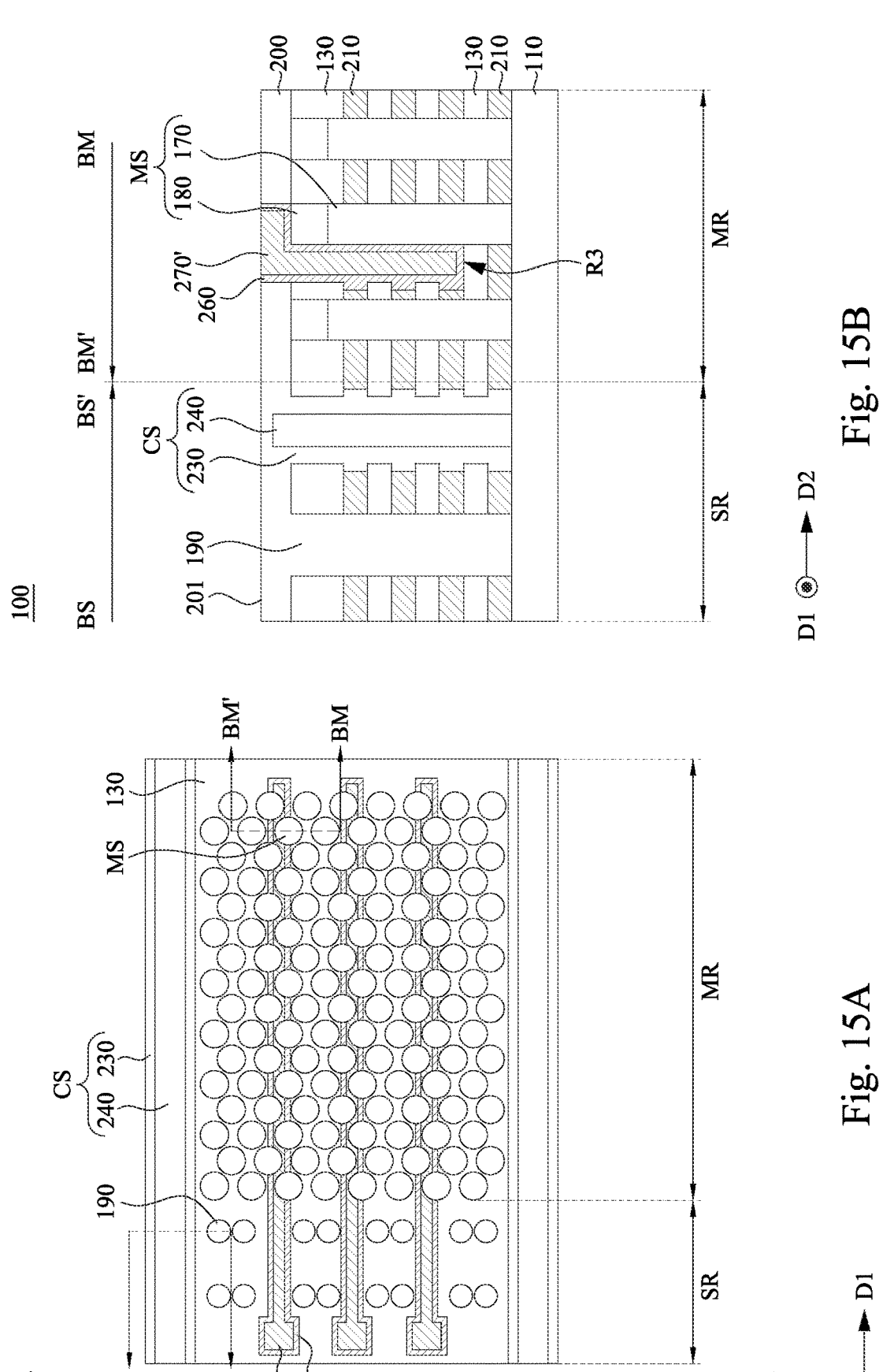

FIG. 15A is a top view of a step of manufacturing the memory device 100, and FIG. 15B is a cross-sectional view of the memory region MR and the staircase region SR of the memory device 100 respectively taken along line BS-BS' and line BM-BM' in FIG. 15A. Referring to FIGS. 15A and 15B, after forming the dielectric layers 260' and the conductive material layers 270', a planarization process (e.g., CMP process) is performed to remove excess materials of the dielectric layers 260' and excess materials of the conductive material layers 270'. A portion of the dielectric layers 260' is etched to form the select gate dielectric layers 260. In some embodiments, the isolation layer 200 serves as an etching stop layer for performing the planarization process, such that a top surface of the conductive material layer 270', a top surface of the select gate dielectric layer 260 and the top surface 201 of the isolation layer 200 are substantially coplanar.

Figures 16A, 16B:
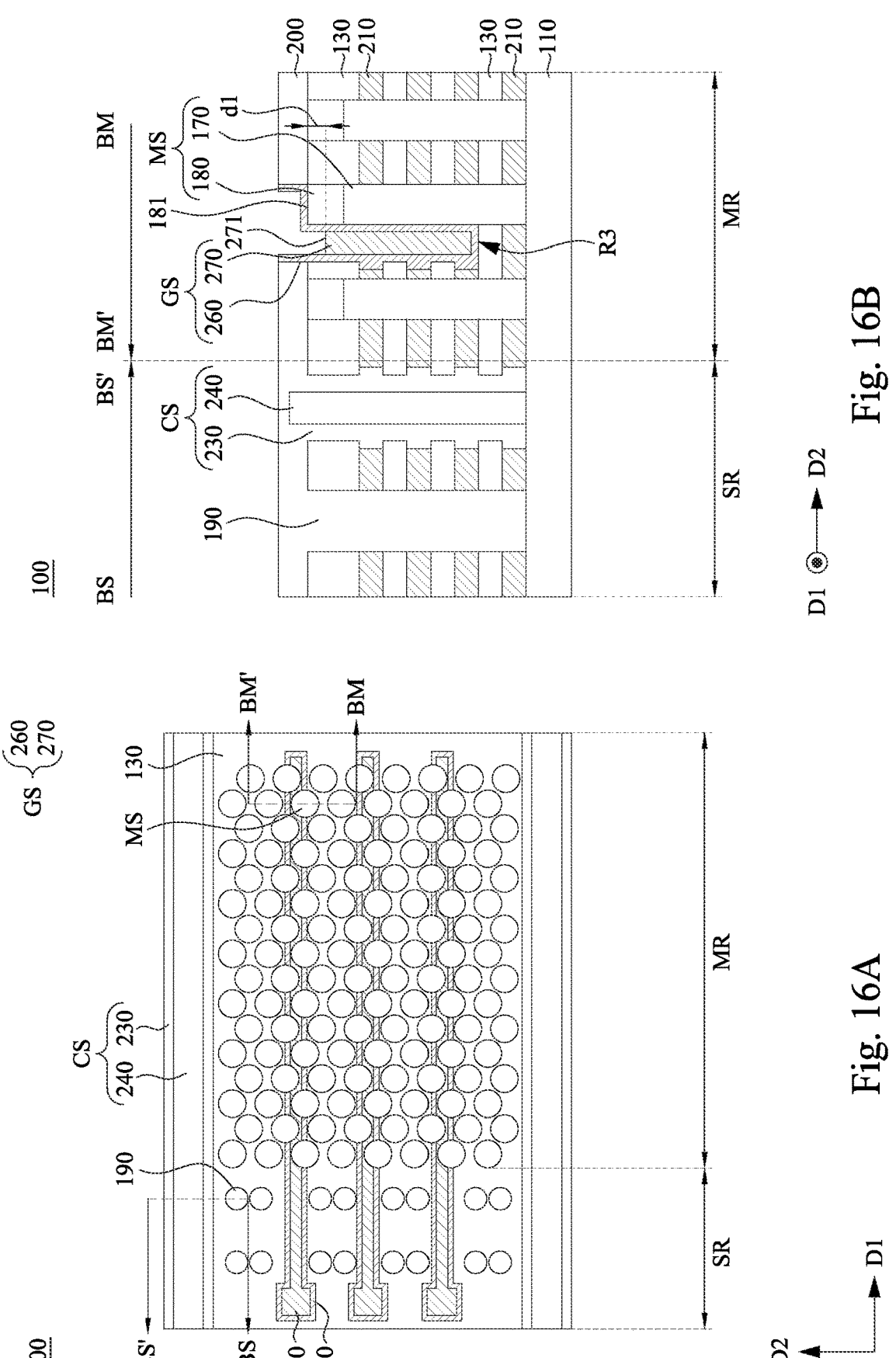

FIG. 16A is a top view of a step of manufacturing the memory device 100, and FIG. 16B is a cross-sectional view of the memory region MR and the staircase region SR of the memory device 100 respectively taken along line BS-BS' and line BM-BM' in FIG. 16A. Referring to FIGS. 15A to 16B, after performing the planarization process, an etching-back process is performed to remove a portion of the conductive material layers 270'. In greater details, the conductive material layers 270' are etched to form select gate electrodes 270, such that select gate structures GS including the select gate dielectric layers 260 and the select gate electrodes 270 are defined in the respective recess R3. As shown in FIG. 16B, a top surface 271 of the select gate electrode 270 of the select gate structure GS is between a top surface 181 of the conductive plug 180 of the memory structure MS and a top surface 211 of a topmost layer of the conductive layers 210. Therefore, bridge phenomena between the bit line contact to be subsequently formed (e.g., bit line contact 320 in FIGS. 19A-19C) and the select gate electrode 270 can be avoided or prevented. The "bridge phenomena" herein refers to the select gate electrode 270 is shorted to the bit line contact. In some embodiments, the top surface 271 of the select gate electrode 270 is separated from the top surface 181 of the conductive plug 180 of the memory structure MS by a distance d1, in which the distance d1 is in the range of about 500 angstroms to about 1600 angstroms (e.g., 800 angstroms). In some embodiments, the select gate structures GS are formed after forming the contact structure CS.

In some embodiments, as shown in FIG. 16B, a lengthwise direction of the select gate structure GS is substantially perpendicular to a lengthwise direction of each of the conductive layers 210 (or the dielectric layers 130). In some embodiments, as shown in FIG. 16A, each of the select gate dielectric layers 260 surrounds (or wraps) the respective select gate electrode 270. In some embodiments, the memory device 100 includes select transistors. Each of the select transistor includes the select gate structure GS, a first source/drain region (i.e., the conductive plug 180), and a second source/drain region (i.e., a portion of the substrate 110 in contact with the memory structure MS, in which the memory structure MS is in contact with the gate structure GS).

Figures 17A, 17B:
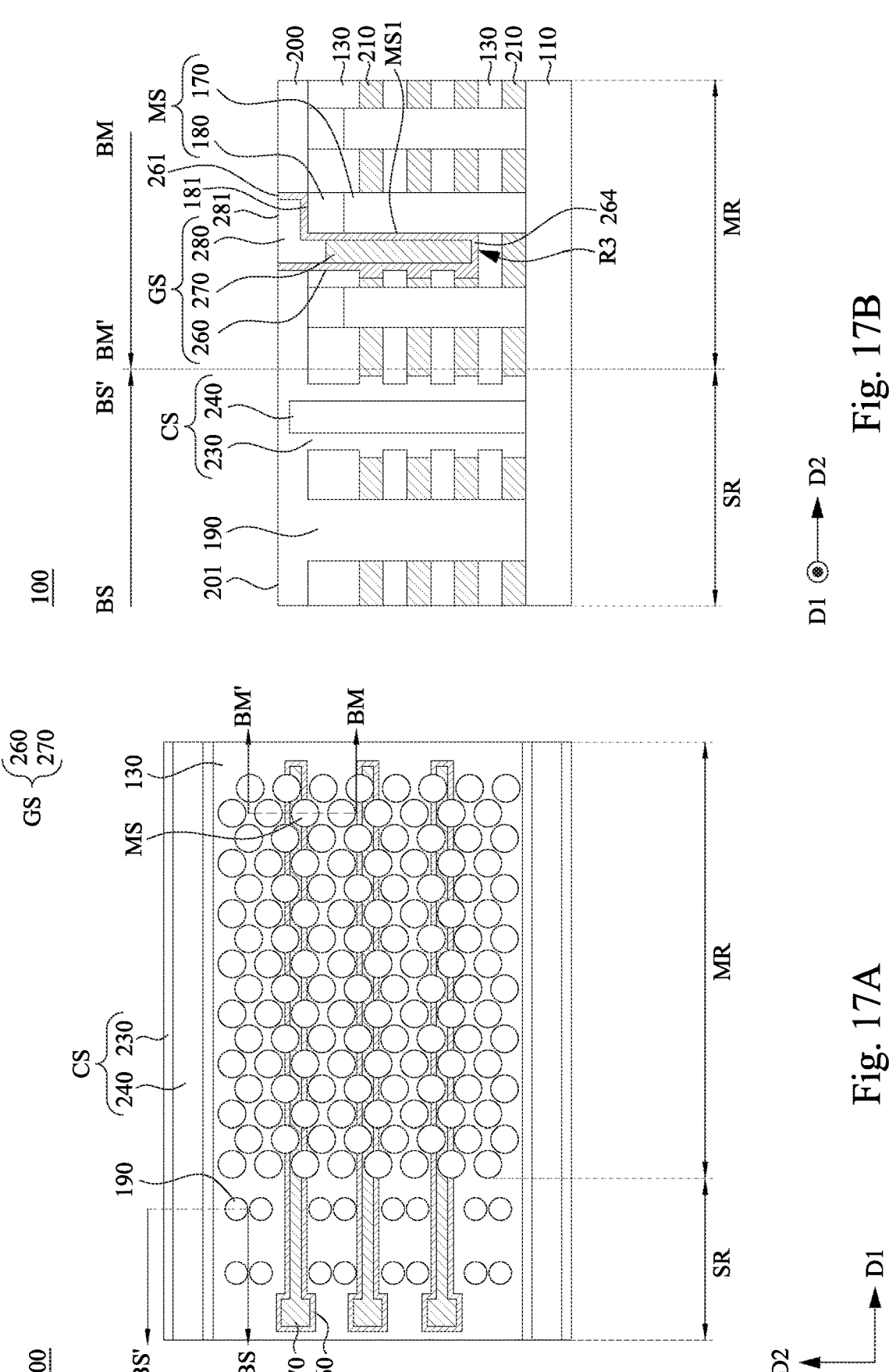

FIG. 17A is a top view of a step of manufacturing the memory device 100, and FIG. 17B is a cross-sectional view of the memory region MR and the staircase region SR of the memory device 100 respectively taken along line BS-BS' and line BM-BM' in FIG. 17A. Referring to FIGS. 17A and 17B, cap layers 280 are formed on the select gate electrodes 270 and the select gate dielectric layers 260. It is noted that the cap layers 280 are not illustrated in FIG. 17A (omitted in FIG. 17A) but illustrated in FIG. 17B for the purpose of simplicity and clarity. The cap layers 280 may be formed by using a chemical vapor deposition process, an atomic layer deposition process, a physical vapor deposition process or other suitable deposition processes. The cap layer 280 may include oxide (e.g., silicon oxide) or other suitable dielectric materials. In some embodiments, the cap layer 280 and the isolation layer 200 include the same material, such as oxide. In some embodiments, a material of the select gate dielectric layer 260 is different from a material of the cap layer 280 (and a material of the isolation layer 200).

In some embodiments, each of the select gate structures GS includes the select gate dielectric layer 260, the select gate electrode 270, and the cap layer 280, in which the select gate dielectric layer 260 surrounds the select gate electrode 270 and the cap layer 280. The select gate dielectric layer 260 extends toward and covers the top surface 181 of the conductive plug 180. In greater details, the select gate dielectric layer 260 is disposed on the sidewall MS1 of the memory structure MS, on the sidewalls of the isolation layer 200, and on the sidewalls of the dielectric layers 130 and the sidewalls of the conductive layers 210. Furthermore, the select gate dielectric layer 260 includes a portion 264 below (e.g., directly below) the select gate electrode 270.

In some embodiments, as shown in FIG. 17B, a planarization process (e.g., CMP process) is performed to remove excess materials of the cap layer 280, such that a top surface 281 of the cap layer 280, a top surface 261 of the select gate dielectric layer 260, and the top surface 201 of the isolation layer 200 are substantially coplanar. In some embodiments, as shown in FIG. 17B, the top surface 261 (or topmost surface) of the select gate dielectric layer 260 is above a top surface of the select gate electrode 270. In some embodiments, as shown in FIG. 17B, a vertical projection area of the select gate electrode 270 on a top surface of the substrate 110 is within a vertical projection area of the select gate dielectric layer 260 on a top surface of the substrate 110.

Figure 18B:
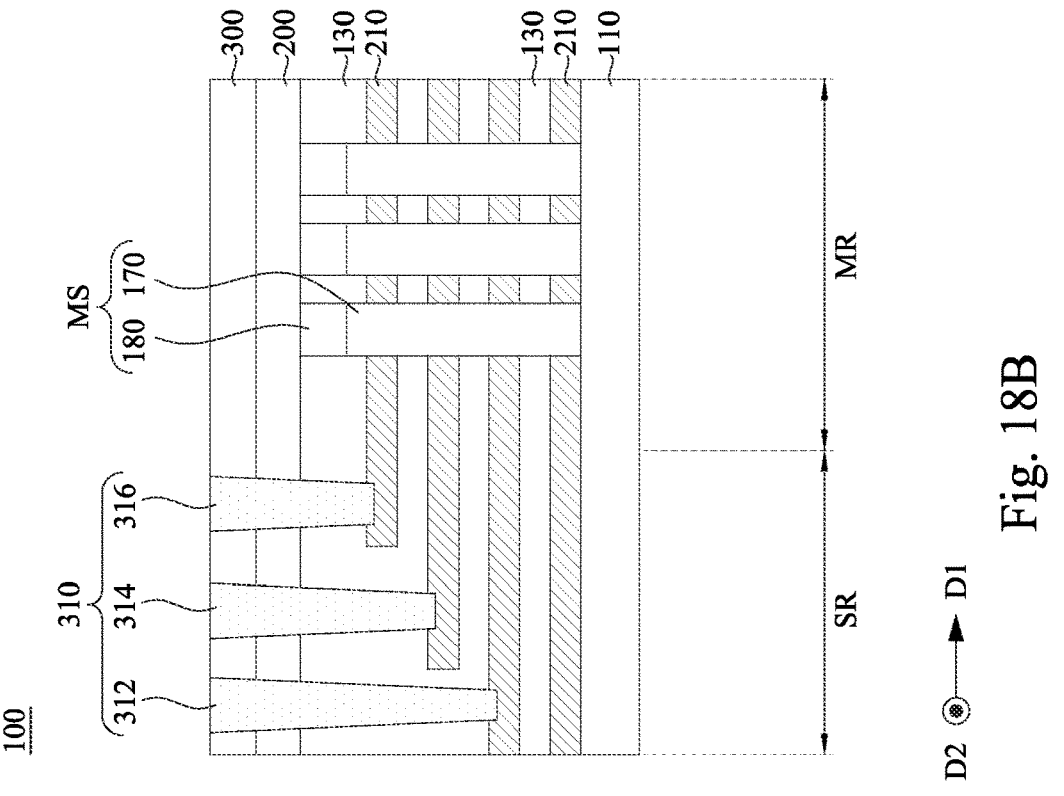
Figure 18A:
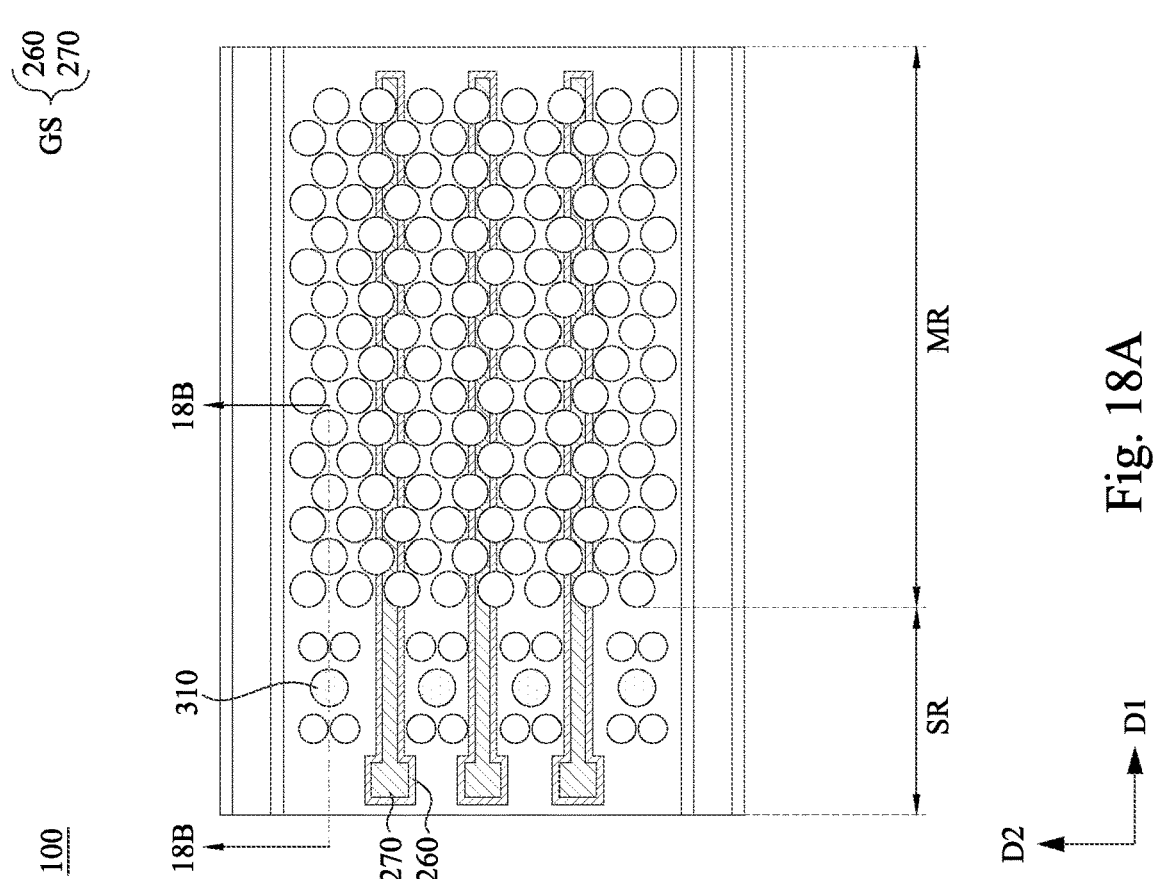

FIG. 18A is a top view of a step of manufacturing the memory device 100, and FIG. 18B is a cross-sectional view of the memory device 100 taken along line 18B-18B in FIG. 18A. Referring to FIGS. 18A and 18B, an isolation layer 300 is formed on the isolation layer 200. The isolation layer 300 may be formed by using a chemical vapor deposition process, an atomic layer deposition process, a physical vapor deposition process or other suitable deposition processes. The isolation layer 300 may include oxide (e.g., silicon oxide) or other suitable dielectric materials. In some embodiments, since the isolation layer 300 and the isolation layer 200 include the same material (e.g., oxide), there is no interface between the isolation layer 300 and the isolation layer 200.

After forming the isolation layer 300, a plurality of word line contacts 310 are formed in the staircase region SR. In greater details, the isolation layer 300, the isolation layer 200 and the dielectric layers 130 in the staircase region SR may be etched to form a plurality of trenches, and then conductive materials are filled in the trenches to form the plurality of word line contacts 310 above the substrate 110. As a result, the word line contacts 310 are respectively electrically connected to the conductive layer 210. That is, each of the word line contacts 310 is electrically connected to a respective conductive layer 210. The word line contacts 310 may include metal, such as tungsten, or other suitable conductive materials. In some embodiments, the word line contacts 310 and the conductive layers 210 include the same material (e.g., tungsten). In some embodiments, each of the word line contacts 310 includes a bottom portion in the conductive layers 210.

It is noted that each of the word line contacts 310 are electrically connected to the respective conductive layer 210 in the staircase region SR, and thus the number of the word line contacts 310 corresponds to (e.g., are equal to) the number of conductive layers 210. Furthermore, the number of the word line contact 310 in FIG. 18A is omitted and illustrated as one for the purpose of simplicity and clarity. That is, the word line contact 310 of FIG. 18A corresponds to word line contacts 312, 314, and 316 of FIG. 18B.

Figures 19A, 19B:
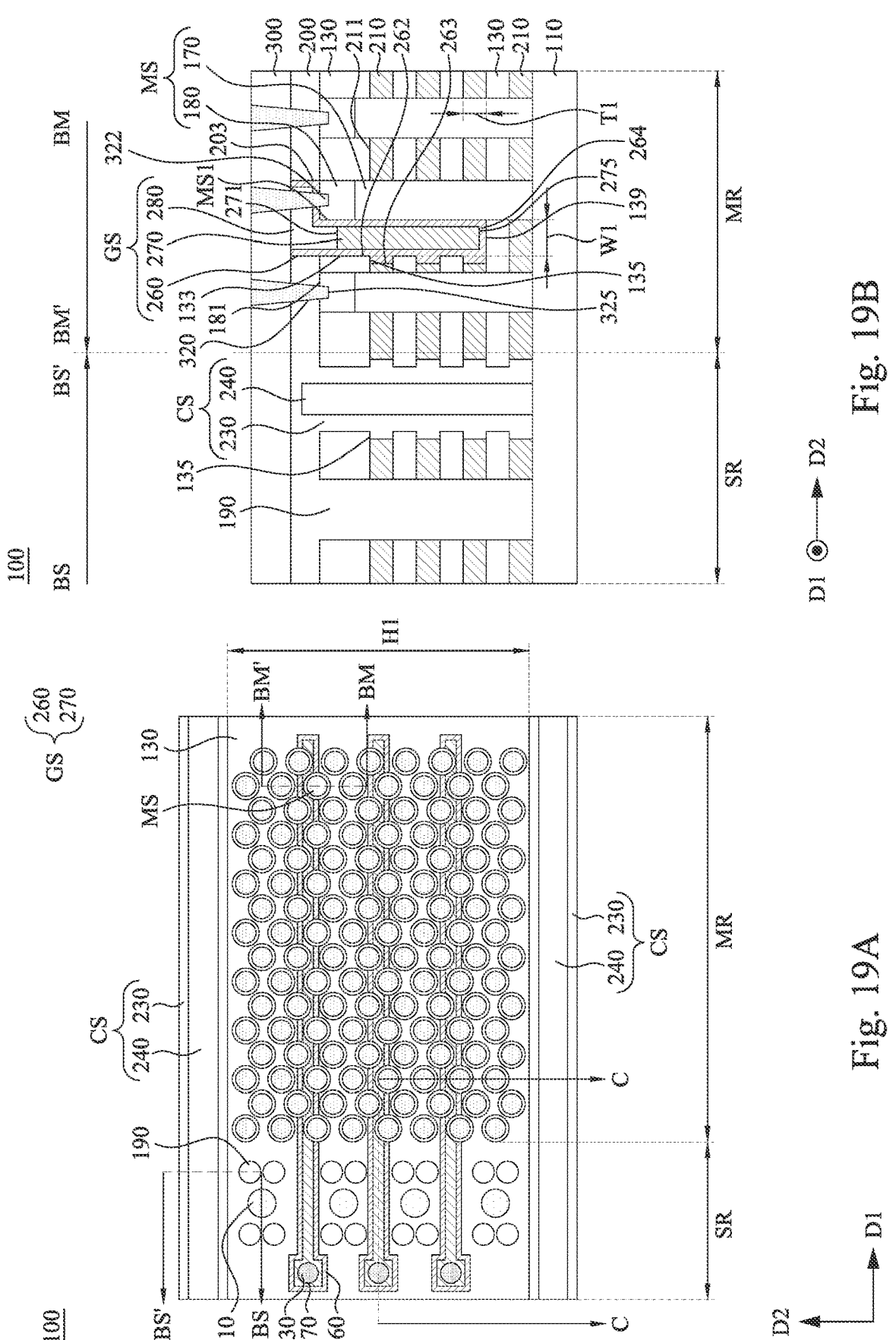
Figure 19C:
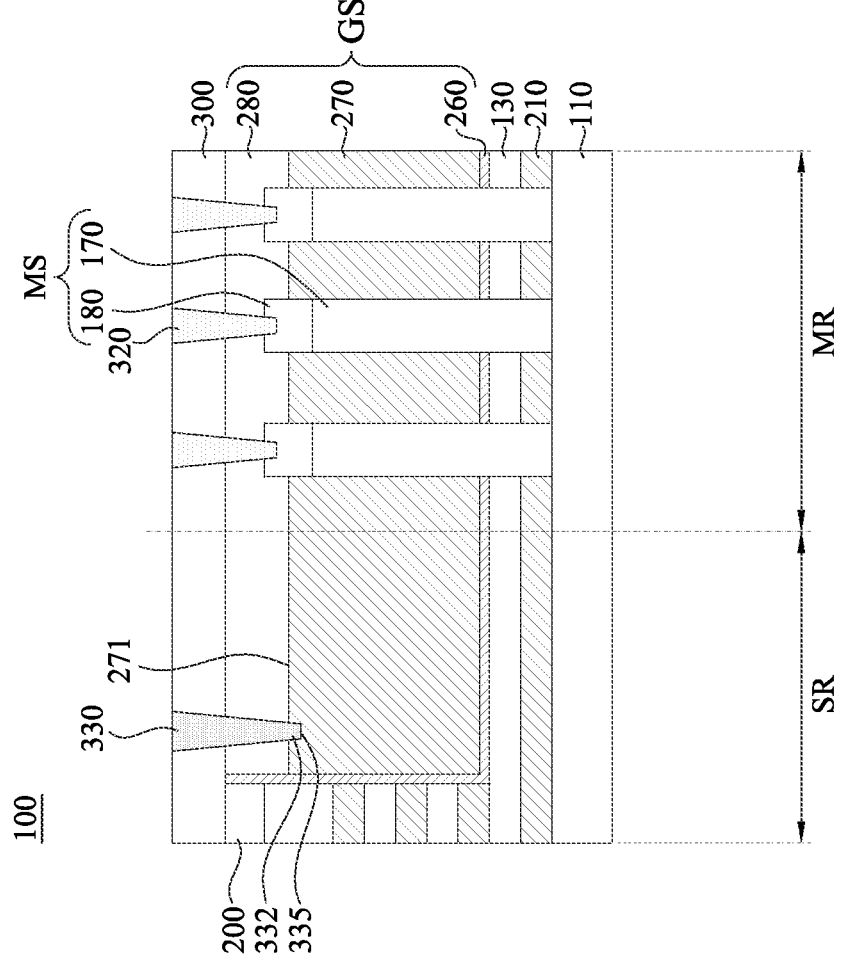
FIG. 19C is a cross-sectional view taking along line C-C of FIG. 19A.

FIG. 19A is a top view of a step of manufacturing the memory device 100, FIG. 19B is a cross-sectional view of the memory region MR and the staircase region SR of the memory device 100 respectively taken along line BS-BS' and line BM-BM' in FIG. 19A, and FIG. 19C is a cross-sectional view of the memory device 100 taken along line C-C in FIG. 19A. Referring to FIGS. 19A to 19C, after forming the select gate structures GS, a plurality of bit line contacts 320 are formed in the memory region MR. In greater details, the isolation layer 300 and the isolation layer 200 in the memory region MR may be etched to form a plurality of trenches, and then conductive materials are filled in the trenches to form the plurality of bit line contacts 320. The bit line contacts 320 may include metal (e.g., tungsten) or other suitable conductive materials. In some embodiments, the bit line contacts 320, the conductive layers 210, and the select gate electrodes 270 of the select gate structures GS include the same material (e.g., tungsten). In some embodiments, as shown in FIG. 19B, one of the bit line contacts 320 downwards penetrates through the cap layer 280 and the gate dielectric layer 260 of the select gate structure GS. In some embodiments, each of the bit line contact 320 includes a bottom portion 322 embedded in the conductive plug 180 of each of the memory structures MS. In other words, a bottom surface 325 of each of the bit line contacts 320 is below the top surface 181 of the conductive plug 180 of each of the memory structures MS. One of the bit line contacts 320 is in contact with the isolation layer 300, the isolation layer 200, the cap layer 280, the select gate dielectric layer 260 and the conductive plug 180, while the one of the bit line contacts 320 is separated from the select gate electrode 270.

As shown in FIG. 19A to FIG. 19C, after forming the select gate structures GS, a plurality of select gate contacts 330 are formed in the staircase region SR. In greater details, the isolation layer 300 and the isolation layer 200 in the staircase region SR may be etched to form a plurality of trenches, and then conductive materials are filled in the trenches to form the plurality of select gate contacts 330. The select gate contacts 330 may include metal, such as tungsten, or other suitable conductive materials. In some embodiments, the select gate contacts 330, the conductive layers 210, and the select gate electrodes 270 of the select gate structures GS include the same material (e.g., tungsten). In some embodiments, select gate contacts 330 and bit line contacts 320 are formed simultaneously. In other words, forming the select gate contacts 330 and forming the bit line contacts 320 are performed by using one (the same) etching process and one (the same) deposition process. The select gate contacts 330 and bit line contacts 320 may include the same material (e.g., tungsten). In some embodiments, as shown in FIG. 19C, each of the select gate contacts 330 downwards penetrates through the cap layer 280, and each of the select gate contacts 330 includes a bottom portion 332 in the select gate electrode 270. In other words, a bottom surface 335 of each of the select gate contacts 330 is below the top surface 271 of the select gate electrode 270. The bottom surface 335 of each of the select gate contacts 330 is below the topmost surface of the select gate dielectric layer 260. In some embodiments, as shown in FIGS. 19A to 19C, the bit line contacts 320 and the select gate contacts 330 are formed after forming the word line contacts 310.

In some embodiments, the memory device 100 includes the substrate 110, the conductive layers 210, the dielectric layers 130, the memory structures MS, the select gate structures GS, and the bit line contacts 320. The conductive layers 210 and the dielectric layers 130 are interlaced and stacked on the substrate 110. The memory structures MS penetrate through the conductive layers 210 and the dielectric layers 130, in which each of the memory structures MS includes the channel structure 170 and the conductive plug 180 disposed on the channel structure 170. Each of the select gate structures GS is disposed on the sidewall MS1 of the memory structure MS, in which each of the select gate structures GS includes the select gate dielectric layer 260 and the select gate electrode 270 surrounded by the select gate dielectric layer 260. The top surface 271 of the select gate electrode 270 is between the top surface 181 of the conductive plug 180 of each of the memory structures MS and the top surface 211 of the topmost layer of the conductive layers 210. The bit line contacts 320 are disposed above the memory structures MS, and the bit line contacts 320 are respectively electrically connected to the memory structures MS. In some embodiments, each of the bit line contacts 320 includes the bottom portion 322 within the conductive plug 180. One of the bit line contacts 320 downwards penetrates through the select gate dielectric layer 260. In other words, the bit line contact 320 includes a portion within the select gate dielectric layer 260. The bit line contact 320 is in contact with the select gate dielectric layer 260 of the select gate structure GS. In some embodiments, the topmost layer of the dielectric layers 130 has the sidewall 133 spaced apart from the memory structure MS, and the minimum distance between the sidewall 133 of the topmost layer of the dielectric layers 130 and the sidewall MS1 of the memory structure MS (i.e., The width W1 of the select gate structure GS in the dielectric layers 130) is greater than the thickness T1 of one of the conductive layers 210.

In some embodiments, as shown in FIG. 19B, the select gate dielectric layer 260 extends toward and covers the top surface 181 of the conductive plug 180. The select gate dielectric layer 260 is in contact with the top surface 181 and the sidewall of the conductive plug 180 of the memory structure MS and the bottom surface 135 of the topmost layer of the dielectric layers 130. The select gate dielectric layer 260 has a first sidewall 262 in contact with the topmost layer of the dielectric layers 130 and a second sidewall 263 in contact with the topmost layer of the conductive layers 210, in which the second sidewall 263 is misaligned with the first sidewall 262. In other words, in the vertical direction of the second direction D2, the select gate dielectric layer 260 includes a portion located directly between the dielectric layers 130 and in contact with the conductive layers 210. The select gate electrode 270 is located on the select gate dielectric layer 260, and the select gate dielectric layer 260 surrounds the select gate electrode 270. The select gate dielectric layer 260 includes the portion 264 (i.e., bottom portion) below the select gate electrode 270. In other words, the select gate dielectric layer 260 is in contact with a bottom surface 275 of the select gate electrode 270.

In some embodiments, as shown in FIG. 19B, the select gate structure GS further includes the cap layer 280. The cap layer 280 is located on the select gate electrode 270, in which the select gate dielectric layer 260 further surrounds the cap layer 280. Specifically, the select gate dielectric layer 260 is disposed on the sidewall of the cap layer 280, and the cap layer 280 and the isolation layer 200 are separated by the select gate dielectric layer 260. The cap layer 280 of the select gate structure GS covers the conductive plug 180 of the memory structure MS.

In some embodiments, as shown in FIGS. 19B and 19C, the memory device 100 further includes the isolation layer 200 located above the conductive layers 210, the dielectric layers 130, and the memory structure MS, in which the select gate dielectric layer 260 of the select gate structure GS is in contact with a sidewall 203 of the isolation layer 200. In some embodiments, the memory device 100 further includes the contact structure CS, in which the contact structure CS is separated from the select gate structure GS. The contact structure CS includes the liner layer 230 and the conductive structure 240. The conductive structure 240 is surrounded by the liner layer 230, and the bottom surface 135 of the topmost layer of the dielectric layers 130 is in contact with the liner layer 230. In some embodiments, the memory device 100 further includes the word line contacts 310 and the select gate contacts 330. The word line contacts 310 are disposed above the conductive layers 210 and respectively electrically connected to the conductive layers 210. The select gate contacts 330 are disposed above the select gate structures GS in the staircase region SR, and the select gate contacts 330 are respectively electrically connected to the select gate structures GS.

In some embodiments, as shown in FIG. 19A, the memory structures MS are arranged in multiple rows along the second direction D2, in which the memory structures MS may be referred as vertical NAND memory strings. The contact structures CS and the select gate structures GS extend along the first direction D1. A block height H1 is a distance between adjacent contact structures CS (upper and lower contact structures CS in FIG. 19A), and the block height H1 is defined as the row number of the memory structures MS. For example, in FIG. 19A, the block height H1 of the memory device 100 is defined as a 16-row-memory-structure. Since each of the select gate structures GS is disposed on the sidewall of the respective memory structure MS, space of the memory device 100 can be saved and the block height of the memory device 100 can be reduced, thereby improving the density and usage efficiency of the memory device 100. For example, if dummy memory structures are additionally manufactured and the select gate structure is disposed on the dummy memory structure, the block height would be increased, thereby reducing the density of the memory device and reducing the usage efficiency. In some embodiments, as shown in FIG. 19A, the select gate structures GS extend between the staircase region SR and the memory region MR. Each of the select gate structures GS is in contact with two rows of the memory structures MS, while each of the select gate structures GS is spaced apart from the pillar structures 190 and the word line contacts 310. In other words, each of the select gate structures GS intersects the two rows of memory structures MS and divided the pillar structures 190 and the word line contacts 310 into sub-blocks.

FIGS. 21-25 are top views of a process at various stages of a manufacturing method of a memory device according to some embodiments of the present disclosure. Referring to FIGS. 1A, 1B, 2A, 2B and 21, prior to forming the sacrificial structures 140 in the recesses R1, spacer layers 340 may be formed in the recesses R1 in advance. In other words, the spacer layers 340 are formed in the recesses R1, and then the sacrificial structures 140 are formed on the spacer layers 340 and filled in the recesses R1. Thereafter, referring to the embodiments shown in FIGS. 4A, 4B and 20, the memory structures MS are formed penetrating through the sacrificial material layers 120 and the dielectric layers 130. The memory structures MS in FIG. 21 are similar to or the same as the memory structure MS in FIG. 20. As shown in the top view of FIG. 21, each of the memory structures MS includes the memory structure layer 155, the channel layer 160, and the dielectric structure 165, in which the memory structure layer 155, the channel layer 160, and the dielectric structure 165 are arranged in a concentric manner. The channel layer 160 is separated from the sacrificial structure 140 by the memory structure layer 155. Two memory structures MS in adjacent rows have a minimum distance d2 therebetween. In some embodiments, the minimum distance d2 between the two memory structures MS is smaller than about 20 nanometers, such that the space of the recess R1 would not be enough for the conductive material structure (see the conductive material structure 220 in FIG. 8B) to be subsequently formed having a void. In some embodiments, the spacer layers 340 include a material having a high etching selectivity relative to the memory structure layer 155 of the memory structure MS. For example, the spacer layers 340 include polysilicon, silicon carbonitride, a combination of silicon nitride and oxide, or other suitable materials.

Referring to FIG. 22, an entirety of the sacrificial structures 140 in the recess R1 is removed to expose the sidewall MS1 of the memory structure MS. Referring to FIG. 23, a portion of the memory structure layer 155 of each of the memory structures MS in the recess R1 is removed to expose the channel layer 160 of each of the memory structures MS in the recess R1. Therefore, a minimum distance between the two memory structures MS can be enlarged (i.e., enlarged to a minimum distance d3), such that the conductive material structure to be subsequently formed (see the conductive material structure 220 in FIG. 8B) can have a void. For example, the minimum distance d3 between the two memory structures MS is in a range of about 20 nm to about 80 nm (e.g., about 70 nm).

Referring to FIG. 24, after removing the portion of the memory structure layer 155 of each of the memory structures MS in the recess R1, an entirety of the spacer layers 340 is removed. In some embodiments, removing the spacer layers 340 is performed by using a wet etching process, and an etching solution of the wet etching process uses a combination of hydrofluoric acid solution and phosphoric acid solution. Since there is a high etch selectivity between the spacer layers 340 and the memory structure layer 155, the memory structure layer 155 may not be etched (substantially unchanged) during the etching process for removing the spacer layers 340. Referring to FIG. 25, the sacrificial structures 140 are formed again such that the sacrificial structures 140 are in contact with the memory structure layer 155 and the channel layer 160 of the memory structure MS. After performing the step in FIG. 25, the step in FIGS. 5A and 5B (i.e., forming the pillar structures 190 and the isolation layer 200) may be performed continuously.

Figure 26:
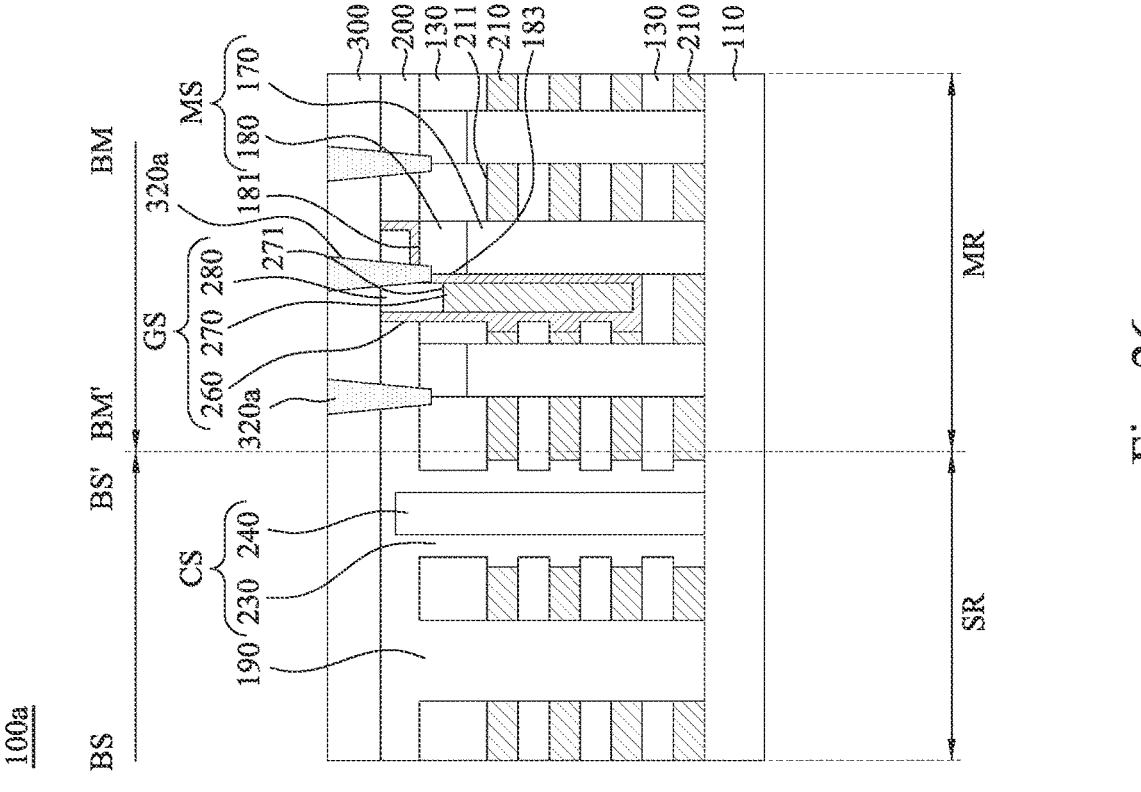
FIG. 26 is a cross-sectional view of a memory device according to some embodiments of the present disclosure.

FIG. 26 is a cross-sectional view of a memory device 100a according to some embodiments of the present disclosure. The memory device 100a of FIG. 26 is substantially the same as the memory device 100 of FIG. 19B, and the difference is the configuration of bit line contacts 320a. One of the bit line contacts 320a is disposed at the junction of the top surface 181 and the sidewall 183 of the conductive plug 180 of one of the memory structures MS. Since the top surface 271 of the select gate electrode 270 of the select gate structure GS is between the top surface 181 of the conductive plug 180 of the memory structure MS and the top surface 211 of the topmost layer of the conductive layers 210. As a result, the bridge phenomena between one of the bit line contacts 320a and the select gate electrode 270 can be avoided or prevented. Configurations and materials regarding the substrate 110, the conductive layers 210, the dielectric layers 130, the isolation layer 200, the isolation layer 300, the memory structures MS, the select gate structure GS, the contact structure CS and the pillar structure 190 of the memory device 100a of FIG. 26 are similar to or the same as those described in the embodiments of FIG. 19B, and, therefore, a description in this regard will not be repeated hereinafter.

According to the aforementioned embodiments of the present disclosure, since the select gate structure is disposed on the sidewall of the memory structure, the density and the usage efficiency of the memory device can be improved. Furthermore, since the top surface of the select gate electrode is between the top surface of the conductive plug and the top surface of the topmost layer of the conductive layers, bridge phenomena between the bit line contact and the select gate electrode can be avoided or prevented.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A memory device, comprising:
a substrate;
a plurality of conductive layers and a plurality of dielectric layers interlaced and stacked on the substrate;
a memory structure penetrating through the conductive layers and the dielectric layers, wherein the memory structure includes a channel structure and a conductive plug disposed on the channel structure;
a select gate structure disposed on a sidewall of the memory structure, wherein the select gate structure includes a select gate dielectric layer and a select gate electrode surrounded by the select gate dielectric layer, wherein a top surface of the select gate electrode is between a top surface of the conductive plug and a top surface of a topmost layer of the conductive layers, wherein the select gate structure further comprises a cap layer on the select gate electrode; and
a bit line contact electrically connected to the memory structure, wherein the bit line contact penetrates through the cap layer and the select gate dielectric layer of the select gate structure.

2. The memory device of claim 1, wherein the bit line contact comprises a bottom portion embedded in the conductive plug.

3. The memory device of claim 1, wherein a topmost layer of the dielectric layers has a sidewall spaced apart from the memory structure, and a minimum distance between the sidewall of the topmost layer of the dielectric layers and the sidewall of the memory structure is greater than a thickness of one of the conductive layers.

4. The memory device of claim 3, wherein a ratio of the minimum distance to the thickness is in a range of about 1 to about 4.

5. The memory device of claim 1, wherein the bit line contact is in contact with the select gate dielectric layer of the select gate structure.

6. The memory device of claim 1, further comprising:
a plurality of word line contacts above the substrate, wherein the word line contacts are respectively electrically connected to the conductive layers.

7. The memory device of claim 1, further comprising:
a contact structure penetrating through the conductive layers and the dielectric layers, and the contact structure is spaced apart from the select gate structure.

8. The memory device of claim 1, further comprising:
a select gate contact electrically connected to the select gate electrode.

9. A memory device, comprising:
a substrate;
a plurality of conductive layers and a plurality of dielectric layers interlaced and stacked on the substrate;
a memory structure penetrating through the conductive layers and the dielectric layers, wherein the memory structure includes a channel structure and a conductive plug disposed on the channel structure; and
a select gate structure penetrating through at least one of the conductive layers and at least one of the dielectric layers, and the select gate structure is in contact with the memory structure, wherein the select gate structure comprises:
a select gate dielectric layer extending toward and covering a top surface of the conductive plug of the memory structure; and
a select gate electrode disposed on the select gate dielectric layer, and the select gate dielectric layer surrounding the select gate electrode.

10. The memory device of claim 9, wherein the select gate dielectric layer comprises a portion below the select gate electrode.

11. The memory device of claim 9, wherein the select gate structure further comprises a cap layer on the select gate electrode, wherein the select gate dielectric layer further surrounds the cap layer.

12. The memory device of claim 11, wherein the cap layer of the select gate structure covers the conductive plug of the memory structure.

13. The memory device of claim 9, further comprising:
an isolation layer disposed above the conductive layers, the dielectric layers and the memory structure, wherein the select gate dielectric layer of the select gate structure is in contact with a sidewall of the isolation layer.

* * * * *